United States Patent
Duffey et al.

(10) Patent No.: US 9,599,510 B2
(45) Date of Patent: Mar. 21, 2017

(54) ESTIMATION OF SPECTRAL FEATURE OF PULSED LIGHT BEAM

(71) Applicants: Cymer, LLC, San Diego, CA (US); ASML Netherlands B.V., Veldhoven (NL)

(72) Inventors: Thomas P. Duffey, San Diego, CA (US); Herman Philip Godfried, Amsterdam (NL)

(73) Assignees: Cymer, LLC, San Diego, CA (US); ASML Netherlands B.V., Veldhoven (NL)

( * ) Notice: Subject to any disclaimer, the term of this patent is extended or adjusted under 35 U.S.C. 154(b) by 168 days.

(21) Appl. No.: 14/488,684

(22) Filed: Sep. 17, 2014

(65) Prior Publication Data

US 2015/0355025 A1    Dec. 10, 2015

Related U.S. Application Data

(60) Provisional application No. 62/007,615, filed on Jun. 4, 2014.

(51) Int. Cl.
*G03B 27/32* (2006.01)
*G03B 27/54* (2006.01)
(Continued)

(52) U.S. Cl.
CPC .............. *G01J 3/28* (2013.01); *G01J 3/027* (2013.01); *G01J 3/14* (2013.01); *G01J 3/26* (2013.01);
(Continued)

(58) Field of Classification Search
CPC ...... G01J 3/027; G01J 3/14; G01J 3/26; G01J 3/28; G01J 9/00; G01J 11/00;
(Continued)

(56) References Cited

U.S. PATENT DOCUMENTS 6,493,374 B1    12/2002    Fomenkov et al.
6,539,046 B2    3/2003     Newman et al.
(Continued)

FOREIGN PATENT DOCUMENTS

WO    0148881    7/2001

OTHER PUBLICATIONS

International Search Report & Written Opinion, issued by the International Searching Authority in counterpart application PCT Application No. PCT/US15/34025, mailed Sep. 14, 2015, 16 pages.
Bertrand Le Gratiet et al., "Intrafield Process Control for 45 nm CMOS logic patterning," Proc. of SPIE vol. 7272, 2009, 10 pages.
Bertrand Le-Gratiet et al., "Integration and Automation of DoseMapperTM in a logic fab APC system. Application for 45/40/28nm node," Proc. of SPIE vol. 8324, 2012, 10 pages.
(Continued)

*Primary Examiner* — Colin Kreutzer
(74) *Attorney, Agent, or Firm* — DiBerardino McGovern IP Group LLC

(57) ABSTRACT

A method is described for estimating a spectral feature of a pulsed light beam produced by an optical source and directed toward a wafer of a lithography apparatus. The method includes receiving a set of N optical spectra of pulses of the light beam; saving the received N optical spectra to a saved set; transforming the optical spectra in the saved set to form a set of transformed optical spectra; averaging the transformed optical spectra to form an averaged spectrum; and estimating a spectral feature of the pulsed light beam based on the averaged spectrum.

29 Claims, 16 Drawing Sheets

(51) Int. Cl.

| | |
|---|---|
| G03B 27/74 | (2006.01) |
| H01S 3/10 | (2006.01) |
| H01S 3/13 | (2006.01) |
| G01J 3/28 | (2006.01) |
| G03F 7/20 | (2006.01) |
| G01J 11/00 | (2006.01) |
| G01J 9/00 | (2006.01) |
| G01J 3/14 | (2006.01) |
| G01J 3/26 | (2006.01) |
| G01J 3/02 | (2006.01) |

(52) U.S. Cl.
CPC ............... *G01J 9/00* (2013.01); *G01J 11/00* (2013.01); *G03F 7/70041* (2013.01); *G03F 7/70058* (2013.01); *G03F 7/70575* (2013.01); *G01J 2003/2853* (2013.01)

(58) Field of Classification Search
CPC .......... G01J 2003/2853; G03F 7/70041; G03F 7/70058; G03F 7/70575
USPC ............. 355/67, 68, 71, 774; 372/25, 29.01, 372/29.011, 32
See application file for complete search history.

(56) References Cited

U.S. PATENT DOCUMENTS

| | | | |
|---|---|---|---|
| 6,795,188 | B2 | 9/2004 | Ruck et al. |
| 7,057,705 | B2 | 6/2006 | Heintze |
| 7,304,748 | B2 | 12/2007 | Rafac |
| 2005/0094698 | A1* | 5/2005 | Besaucele ............... H01S 3/036 372/57 |
| 2006/0114957 | A1 | 6/2006 | Algots et al. |
| 2007/0014326 | A1* | 1/2007 | Wakabayashi ...... H01S 3/08009 372/92 |
| 2007/0229849 | A1 | 10/2007 | Rafac |
| 2008/0037025 | A1 | 2/2008 | Rafac |
| 2008/0253408 | A1 | 10/2008 | Ishihara |
| 2008/0253413 | A1 | 10/2008 | Partlo |
| 2009/0157343 | A1 | 6/2009 | Kaushal et al. |
| 2011/0200922 | A1* | 8/2011 | Kohler ................ G03F 7/70575 430/30 |
| 2014/0104614 | A1 | 4/2014 | Rokitski et al. |

OTHER PUBLICATIONS

Donis Flagello, "Evolution of Optical Lithography towards 22nm and beyond," Approaching the Optical Limit: Workshop on Optical Lithography at 22nm and 16nm, May 15, 2008, Bolton Landing, NY, accessible from http://sematech.org/meetings/archives/litho/8373/index.htm, 39 pages.

Jos Benschop et al., "Integrated scatterometry for tight overlay and CD control to enable 20-nm node wafer manufacturing," Proc. of SPIE vol. 8683, 2013, 8 pages.

Wayne J. Dunstan et al., "Active Spectral Control of DUV light sources for OPE minimization," Optical Microlithography XIX, Proc. of SPIE vol. 6154, 2006, 9 pages.

Armen Kroyan et al., "Effects of 95% Integral vs. FWHM Bandwidth Specifications on Lithographic Imaging," Optical Microlithography XIV, Proc. of Spie vol. 4346, 2001, 10 pages.

J. Planchot et al., "Full field lithographical verification using scanner and mask intrafield fingerprint," Optical Microlithography XXV, Proc. of Spie vol. 8326, 2012, 9 pages.

Jos Maas, "Improve your CDU in one month," accessible at http://www.asml.com/doclib/productandservices/images/2009/Spring/Articles/Images_Spring_Edit_2009%2018-19.pdf, ASML Images, Spring Edition, 2009, 2 pages.

Jan Mulkens et al., "Holistic optimization architecture enabling sub-14-nm projection lithography," Journal of Micro/Nanolithography, MEMS, and MOEMS 13(1), 011006, Jan.-Mar. 2014, 11 pages, downloaded from http://spiedigitallibrary.org/ on Apr. 17, 2014.

Uday K. Sengupta, "Krypton fluoride excimer laser for advanced microlithography," Optical Engineering 32(10), 2410-2420 (Oct. 1993), 11 pages.

Robert J. Rafac, "Overcoming limitations of etalon spectrometers used for spectral metrology of DUV excimer light sources," Optical Microlithography XVII, Proc. of Spie vol. 5377, 2004, 13 pages.

David Myers et al., "Production-Ready 2kHz KrF Excimer Laser for DUV Lithography," Optical Microlithography XII, Proc. of SPIE vol. 3679, 1999, 12 pages.

Bertrand Le Gratiet et al., "Improved CD control for 45/40nm CMOS logic patterning. Anticipation for 32/28nm," Proc. SPIE 7638, Metrology, Inspection, and Process Control for Microlithography XXIV, 76380A (Apr. 1, 2010), accessible from http://www.meditec.zeiss.com/C1256C15004B31FF/EmbedTitelIntern/SPIE2010AbstractSTWLCD/$File/SPIE2010_ST_Crolles_paper.pdf, 11 pages.

\* cited by examiner

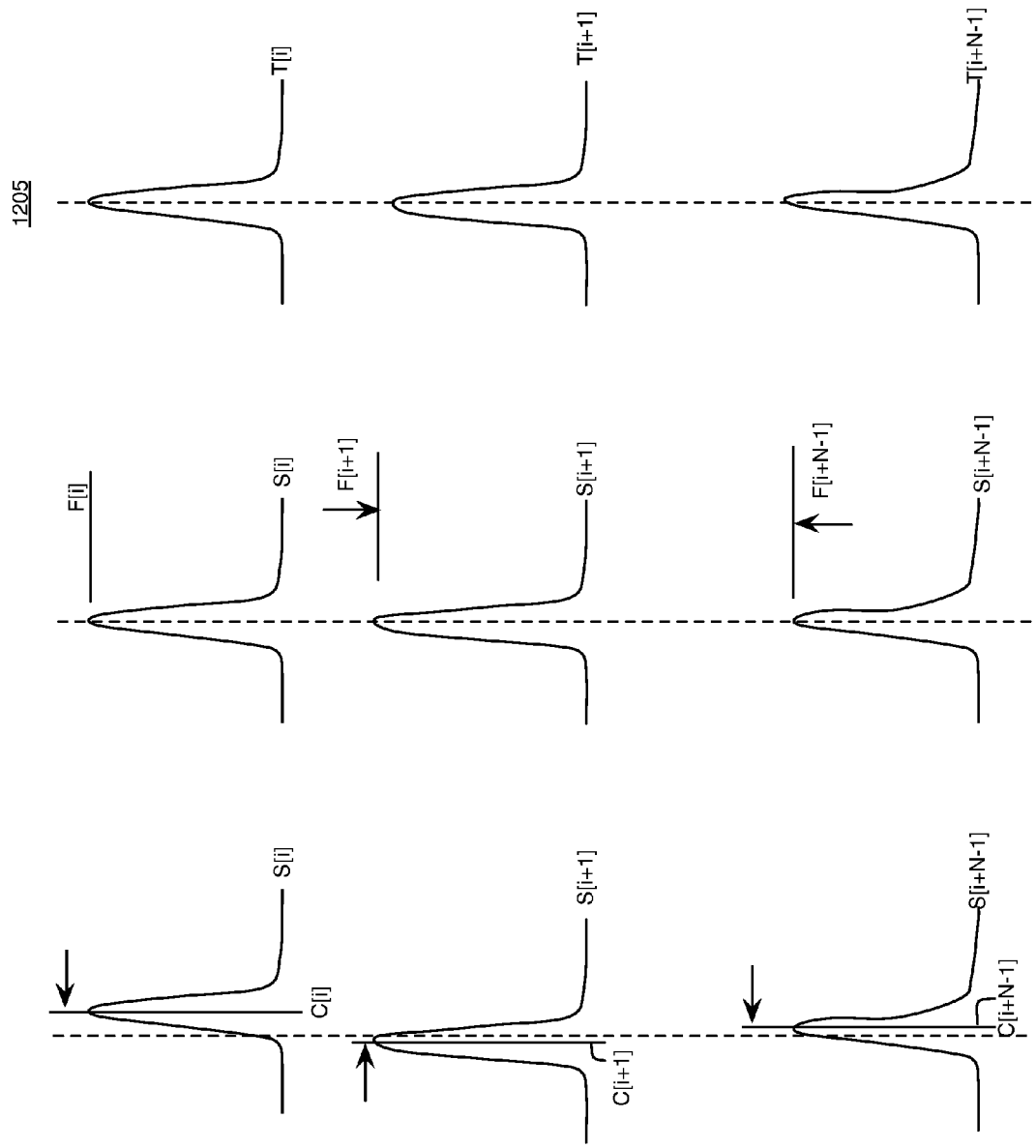

ESTIMATION OF SPECTRAL FEATURE OF PULSED LIGHT BEAM

CROSS-REFERENCE TO RELATED APPLICATION

This application claims priority to U.S. Application No. 62/007,615, filed Jun. 4, 2014, and titled "Estimation of Spectral Feature of Pulsed Light Beam," which is incorporated herein by reference in its entirety.

TECHNICAL FIELD

The disclosed subject matter relates to estimating a spectral feature such as a bandwidth of a light beam output from an optical source that supplies light to a lithography exposure apparatus.

BACKGROUND

An accurate knowledge of spectral features or properties (for example, a bandwidth) of a light beam output from an optical source such as a laser is important in many scientific and industrial applications. For example, accurate knowledge of the optical source bandwidth is used to enable control of a minimum feature size or critical dimension (CD) in deep ultraviolet (DUV) optical lithography. The critical dimension is the feature size that is printed on a semiconductor substrate (also referred to as a wafer) and therefore the CD can require fine size control. In optical lithography, the substrate is irradiated by a light beam produced by an optical source. Often, the optical source is a laser source and the light beam is a laser beam.

SUMMARY

In some general aspects, a method is described for estimating a spectral feature of a pulsed light beam produced by an optical source and directed toward a wafer of a lithography apparatus. The method includes receiving a set of N optical spectra of pulses of the light beam; saving the received N optical spectra to a saved set; transforming the optical spectra in the saved set to form a set of transformed optical spectra; averaging the transformed optical spectra to form an averaged spectrum; and estimating a spectral feature of the pulsed light beam based on the averaged spectrum.

Implementations can include one or more of the following qualities. For example, the set of N optical spectra of pulses of the light beam can be received by receiving the set of N optical spectra of pulses from an output of a detector of a measurement system. The set of N optical spectra of pulses of the light beam can be received by, for each of the N optical spectra of pulses, receiving a signal from a detector that is at an output of an etalon placed in the path of a portion of the pulsed light beam. The portion of the pulsed light beam can be divided from the main portion of the pulsed light beam.

The optical spectra in the saved set can be transformed by estimating a center of each optical spectrum in the saved set; shifting the optical spectra so that all of the estimated centers align; and scaling each optical spectrum.

The optical spectra in the saved set can be transformed by estimating a center of each optical spectrum in the saved set; and shifting the optical spectra so that each of the estimated centers align with a target wavelength.

The method can also include receiving a request to change a wavelength of the pulsed light beam to a new wavelength. The optical spectra in the saved set can be transformed by shifting the optical spectra to align their centers with the new wavelength.

The transformed optical spectra can be averaged by weighting each transformed optical spectrum by a weighting factor; and adding the intensities of each of the weighted optical spectra to form a summed spectrum. The transformed optical spectra can be averaged by reducing the summed spectrum by a value that is a multiple of N.

The spectral feature of the pulsed light beam can be estimated based on the averaged spectrum by estimating a bandwidth value of the pulsed light beam based on the averaged spectrum. The bandwidth value of the pulsed light beam based on the averaged spectrum can be estimated by measuring a width of the averaged spectrum. The width of the averaged spectrum can be measured by measuring a first width of the averaged spectrum at a first parameter and measuring a second width of the averaged spectrum at a second parameter.

The bandwidth value of the pulsed light beam based on the averaged spectrum can be estimated by deconvolving a source optical spectrum from an instrument function of the spectrometer that produces the optical spectra and measuring a width of the deconvolved source spectrum.

The method can also include outputting a signal based on the estimated spectral feature, the signal including a set of commands for operating a spectral property selection system connected to the optical source.

The method can further include scanning the pulsed light beam across the exposure field of the wafer, wherein each exposure field receives a plurality of pulses of the light beam. The spectral feature of the pulsed light beam can be estimated based on the averaged spectrum by estimating the spectral feature within each exposure field of the wafer.

The method can also include removing an oldest optical spectrum from the saved set; receiving an optical spectrum of another pulse of the light beam; and saving the received optical spectrum of the other pulse to the saved set to form a refreshed saved set. The method can also include transforming the optical spectra in the refreshed saved set to form a set of transformed optical spectra; averaging the transformed optical spectra to form an averaged spectrum; and estimating a spectral feature of the pulsed light beam based on the averaged spectrum. The optical spectrum of another pulse of the light beam can be received by receiving the optical spectrum of the next pulse of the light beam that follows the last pulse that forms the set of N optical spectra.

In other general aspects, a method is described for estimating a spectral feature of a pulsed light beam produced by an optical source and directed to an exposure window of a wafer of a lithography apparatus, the exposure window having N pulses. The method includes scanning the pulsed light beam across an exposure field; and for each exposure window within the exposure field, receiving one or more optical spectra of pulses of the scanned light beam; saving the received one or more optical spectra to a saved set; transforming the one or more optical spectra in the saved set to form a set of transformed spectra; averaging the transformed one or more optical spectra to form an averaged spectrum; and estimating a spectral feature of the pulsed light beam across the exposure window of N pulses from the averaged spectrum.

Implementations can include one or more of the following qualities. For example, the one or more optical spectra of pulses of the scanned light beam can be received by receiving the one or more optical spectra of pulses from an output of a detector of a measurement system. The one or more optical spectra of pulses of the light beam can be received by, for each of the optical spectra of pulses, receiving a signal from a detector that is at an output of an etalon placed in the path of a portion of the pulsed light beam. The portion of the pulsed light beam can be divided from the main portion of the pulsed light beam.

The optical spectra in the saved set can be transformed by estimating a center of each optical spectrum in the saved set; shifting the optical spectra so that all of the estimated centers align; and scaling each optical spectrum.

The transformed optical spectra can be averaged by weighting each transformed optical spectrum by a weighting factor; and adding the intensities of each of the weighted optical spectra to form a summed spectrum.

The spectral feature of the pulsed light beam can be estimated based on the averaged spectrum by determining a metric value of the bandwidth of the pulsed light beam based on the averaged spectrum.

Each exposure field can be shifted from the preceding or the succeeding exposure field in time by one or more pulses of the scanned light beam.

The method can include, for at least some of the exposure windows within the exposure field, removing an oldest optical spectrum from the saved set before receiving the one or more optical spectra of pulses of the scanned light beam.

For at least one exposure window within the exposure field, one or more optical spectra of pulses of the scanned light beam can be received by receiving N optical spectra of pulses of the scanned light beam.

In other general aspects, a light system produces a pulsed light beam configured to be directed to an exposure window of N pulses of a lithography exposure apparatus. The light system includes an optical source configured to generate the light beam; a beam directing system configured to direct the light beam to the lithography exposure apparatus; a control system; and a spectral property selection system connected to the optical source. The control system is configured to scan the pulsed light beam across an exposure field; and for each exposure window within the exposure field, receive the optical spectra of pulses of the scanned light beam; save the received optical spectra to a saved set; transform the optical spectra in the saved set to form a set of transformed spectra; average the transformed optical spectra to form an averaged spectrum; estimate a spectral feature of the pulsed light beam across the exposure window of N pulses from the averaged spectrum; and output a signal based on the estimated spectral feature. The spectral property selection system receives the outputted signal and is configured to adjust a spectral property of the light beam within the optical source based on the outputted signal.

In other general aspects, a method is described for controlling a spectral feature of a pulsed light beam produced by an optical source and directed to a wafer of a lithography exposure apparatus. The method includes directing the pulsed light beam from an optical source to the lithography exposure apparatus to thereby expose the wafer with the pulsed light beam; receiving a location at which the pulsed light beam is exposing the wafer; estimating a spectral feature of the pulsed light beam exposing the wafer at the received location, the estimating comprising receiving a plurality of optical spectra of pulses of the light beam, forming a summed spectrum based on the plurality of optical spectra, and calculating a value that represents the spectral feature based on the summed spectrum; and modifying the spectral feature of the pulsed light beam based on the location at which the pulsed light beam is applied to the wafer by adjusting a property of the optical source based on the measured spectral feature.

Implementations can include one or more of the following features. For example, the method can include measuring one or more physical properties of the wafer at the received location, determining whether the one or more physical properties are acceptable, and if it is determined that the one or more physical properties are not acceptable, sending a signal to the optical source to modify the spectral feature of the pulsed light beam that impinges on the wafer to adjust the one or more physical properties at the wafer. At least one of the one or more physical properties can include a critical dimension uniformity of a feature formed on the wafer.

The method can include, before processing the wafer: measuring the one or more physical properties within the scan at each exposure field of one or more previously exposed wafers; and creating a map that estimates how the one or more physical properties vary across an entire wafer that is exposed with the optical source. The spectral feature of the pulsed light beam can be modified based on the location at which the pulsed light beam is applied to the wafer by adjusting a property of the optical source based on the estimated spectral feature comprises looking up values of the one or more physical properties within the created map.

The method of estimating the spectral feature of the light beam output from the optical source enables improved accuracy in estimating the spectral feature as seen by the wafer, allows the scanning of the measurements of the spectral feature, and improves speed and accuracy of other systems and methods that rely on the estimation of the spectral feature. Speckle (due to laser coherence) in the image plane of the spectrometer can modulate the intensity measured and therefore degrades the accuracy and reproducibility of the estimation and characterization of the spectral feature. Random electronic noise and other phenomena also degrade the accuracy and reproducibility of the estimation and characterization of the spectral feature. To improve the estimation and characterization of the spectral feature, a plurality of optical spectra are stored and the calculation is performed on the plurality of optical spectra, and not on each optical spectra, in which the speckle pattern (and electronic noise) is different in each optical spectrum by using a moving diffuser within the spectrometer. This provides more frequent update rates and ability to compensate for pulse-to-pulse fluctuations in fringe position compared to a method that accumulates multiple images on a detector prior to readout. It further enables accurate light source spectral feature estimation in cases in which the light source center wavelength is deliberately being modulated or modified.

DESCRIPTION OF DRAWINGS

FIGS. 14A-14C are schematic diagrams illustrating how each saved optical spectrum is transformed to form a set of transformed optical spectra in accordance with the procedure of FIG. 13;

DESCRIPTION

Figure 1:
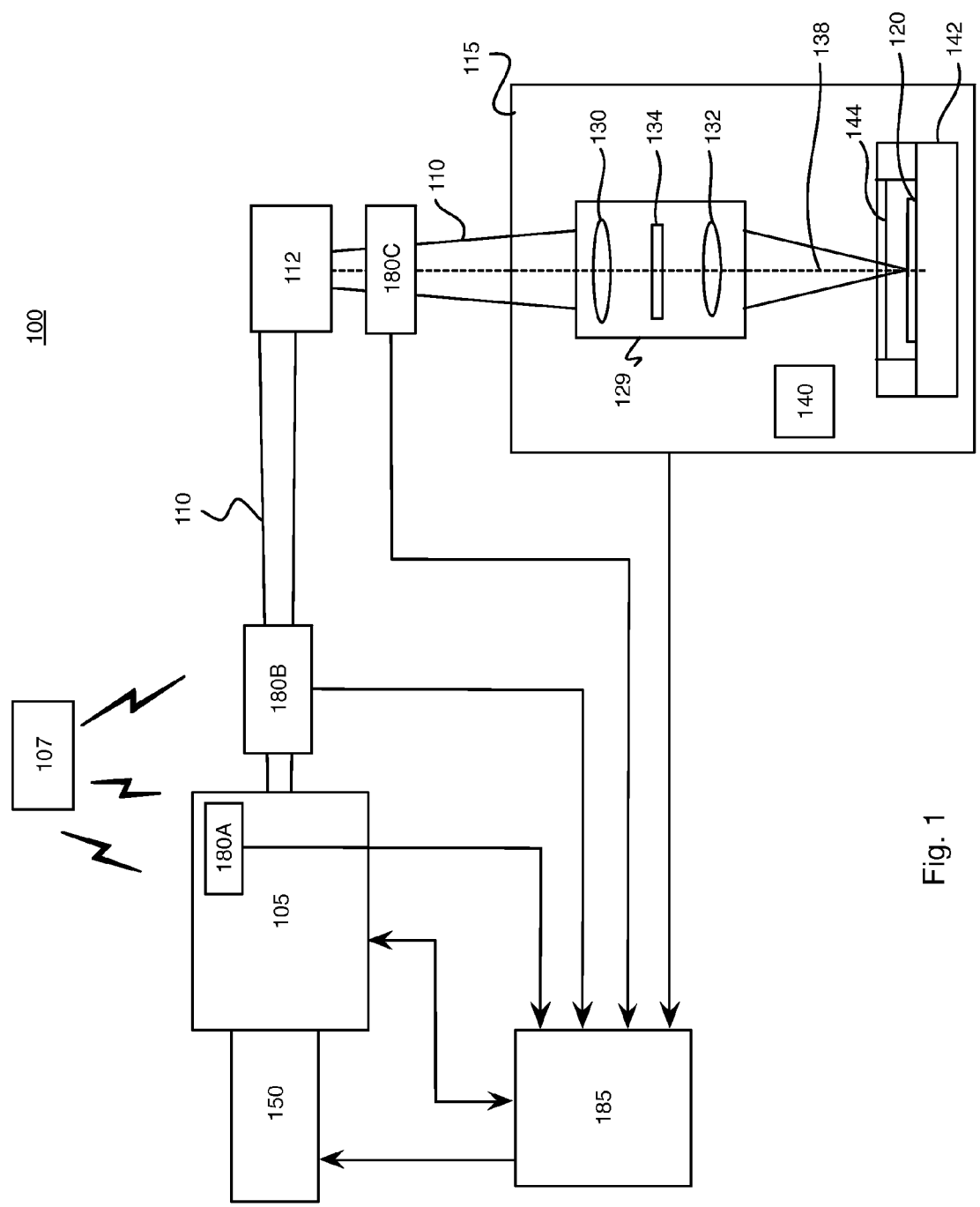
FIG. 1 is a block diagram of a photolithography system that includes an optical source that produces a light beam that is directed to a lithography exposure apparatus.
Figure 2:
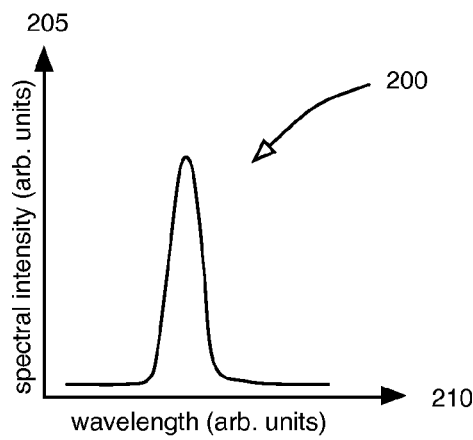
FIG. 2 is a graph of an exemplary optical spectrum, the spectral intensity as a function of a wavelength or optical frequency, of a light beam produced by the optical source of FIG. 1.

Referring to FIG. 1, the optical spectrum (or emission spectrum) of a pulsed light beam 110 produced by an optical source 105 contains information on how the optical energy or power is distributed over different wavelengths. In FIG. 1, the light beam 110 is a part of a photolithography system 100, and the light beam 110 is directed to a lithography exposure apparatus 115 that creates a pattern on a wafer 120. The light beam 110 is also directed through a beam preparation system 112, which can include optical elements that modify aspects of the light beam 110. For example, the beam preparation system 112 can include reflective or refractive optical elements, optical pulse stretchers, and optical apertures (including automated shutters). Referring also to FIG. 2, the optical spectrum 200 of the light beam 110 is depicted in the form of a diagram where the spectral intensity 205 (not necessarily with an absolute calibration) is plotted as a function of the wavelength or optical frequency 210. The optical spectrum 200 can be referred to as the spectral shape or intensity spectrum of the light beam 110. Spectral properties of the light beam 110 include any aspect or representation of the intensity spectrum. For example, bandwidth is a spectral feature. The bandwidth of the light beam is a measure of the width of this spectral shape, and this width can be given in terms of wavelength or frequency of the laser light. Any suitable mathematical construction (that is, metric) related to the details of the optical spectrum 200 can be used to estimate a value that characterizes the bandwidth of the light beam. For example, the full width of the spectrum at a fraction (X) of the maximum peak intensity of the spectral shape (referred to as FWXM) can be used to characterize the light beam bandwidth. As another example, the width of the spectrum that contains a fraction (Y) of the integrated spectral intensity (referred to as EY) can be used to characterize the light beam bandwidth.

The bandwidth of the light beam 110 can be the actual, instantaneous bandwidth of a spectral shape. Various disturbances 107 (such as temperature gradients, pressure gradients, optical distortions, etc.) act on the optical source 105 and the light beam 110 to modify the spectral properties or features of the light beam 110. Thus, the lithography system 100 includes other components, such as a spectral feature selection system 150, one or more measurement systems 180 (such as, for example, 180A, 180B, 180C), and a control system 185, that are used to determine the impact of the disturbances 107 on the light beam 110. The spectral feature selection system 150 receives a light beam from the optical source 105 and finely tunes the spectral output of the optical source 105 based on the input from the control system 185. The one or more measurement systems 180 measure properties such as, for example, spectral features (such as bandwidth and wavelength), or energy, of the light beam 110.

Because of the disturbances 107, the actual bandwidth of the light beam 110 at the wafer 120 may not correspond to or match with the desired bandwidth. Thus, the characteristic bandwidth of light beam 110 needs to be measured or estimated during operation by estimating a value of a metric from the optical spectrum so that an operator or an automated system (for example, a feedback controller) can use the measured or estimated bandwidth to adjust the properties of the optical source 105 and to adjust the spectral shape of the light beam 110. A method is described that enables the estimation of a spectral property or feature such as the bandwidth of the spectral shape of the light beam 110 by updating the measurement of the spectral feature (using, for example, the measurement system 180B) to match how the light beam 110 is scanned across the wafer 120 during an exposure.

The lithography exposure apparatus 115 includes an optical arrangement that includes an illuminator system 129 having, for example, one or more condenser lenses 130, a mask 134, and an objective arrangement 132. The mask 134 is movable along one or more directions, such as along an optical axis 138 of the light beam 110 or in a plane that is perpendicular to the optical axis 138. The objective arrangement 132 includes a projection lens and enables the image transfer to occur from the mask 134 to the photoresist on the wafer 120. The illuminator system 129 adjusts the range of angles for the light beam 110 impinging on the mask 134.

The illuminator system 129 also homogenizes (makes uniform) the intensity distribution of the light beam 110 across the mask 134.

The lithography apparatus 115 can include, among other features, a lithography controller 140, air conditioning devices, and power supplies for the various electrical components. The lithography controller 140 controls how layers are printed on the wafer 120.

In some implementations, the wafer 120 is carried on a wafer stage 142 and an immersion medium 144 can be supplied to cover the wafer 120. The immersion medium 144 can be a liquid (such as water) for liquid immersion lithography. In other implementations in which the lithography is a dry system, the immersion medium 144 can be a gas such as dry nitrogen, dry air, or clean air. In other implementations, the wafer 120 can be exposed within a pressure-controlled environment (such as a vacuum or partial vacuum).

Figure 3A:
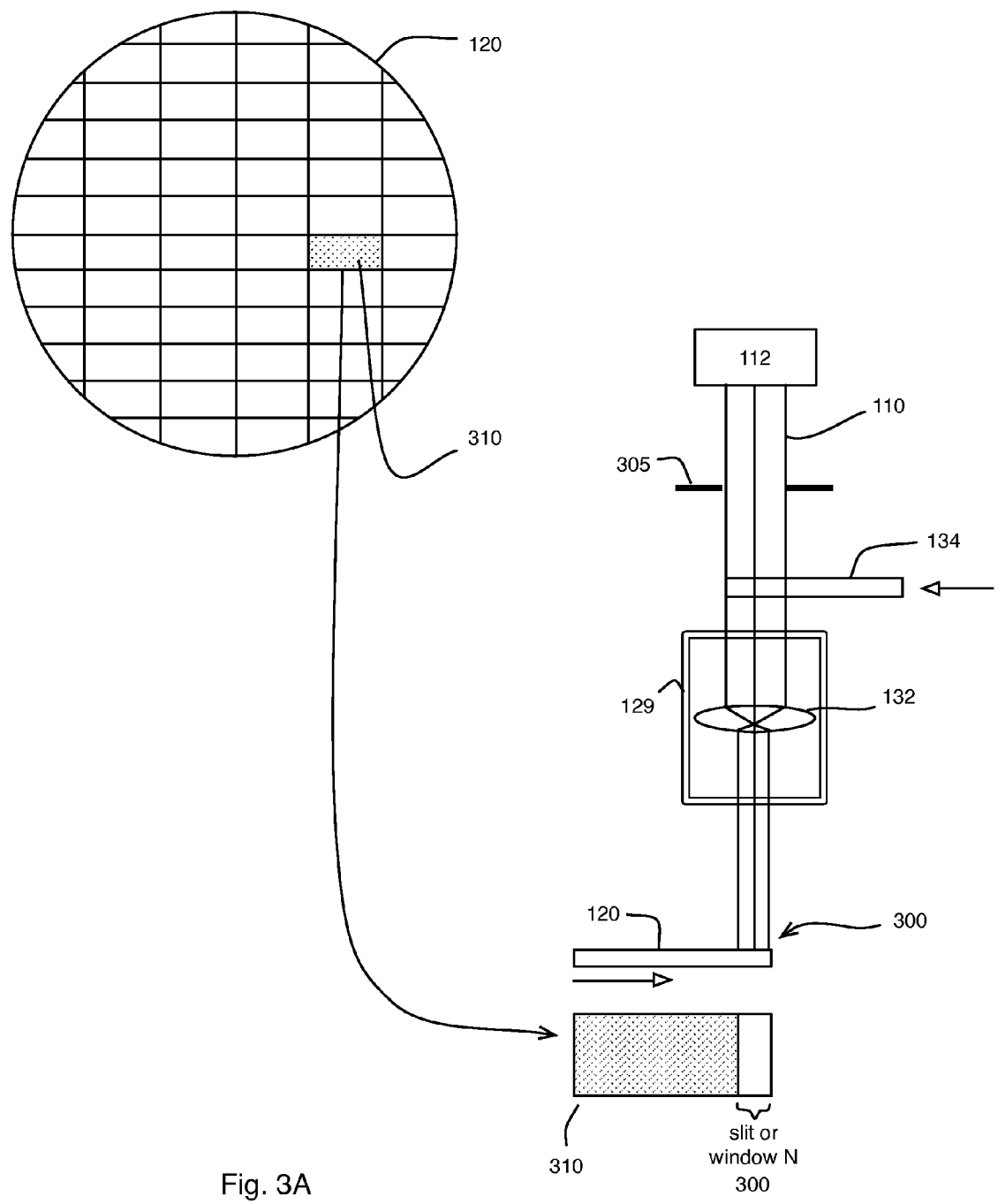
FIG. 3A is a block diagram of an exemplary lithography exposure apparatus of the photolithography system of FIG. 1.

Referring to FIG. 3A, the wafer 120 is irradiated by the light beam 110. A process program or recipe determines the length of the exposure on the wafer 120, the mask 134 used, as well as other factors that affect the exposure. During lithography, a plurality of pulses of the light beam 110 illuminate the same area of the wafer 120 to form an illumination dose. The number of pulses N of the light beam 110 that illuminate the same area can be referred to as an exposure window or slit 300 and the size of this slit 300 can be controlled by an exposure slit 305 placed before the mask 134. The slit 305 can be designed like a shutter and can include a plurality of blades that can be opened and closed; and the size of the exposed area is determined by the distance between the blades in the non-scanning direction and also by the length (the distance) of the scan in the scanning direction. In some implementations, the value of N is in the tens, for example, from 10-100 pulses. In other implementations, the value of N is greater than 100 pulses, for example, from 100-500 pulses.

Figure 3D:
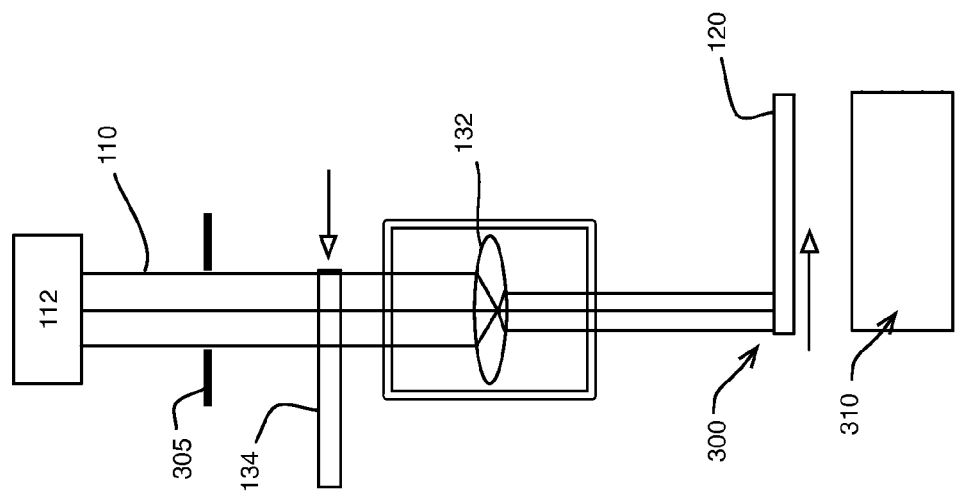
FIGS. 3B-3D are block diagrams of an exemplary lithography exposure apparatus shown during various stages of exposure.
Figure 3C:
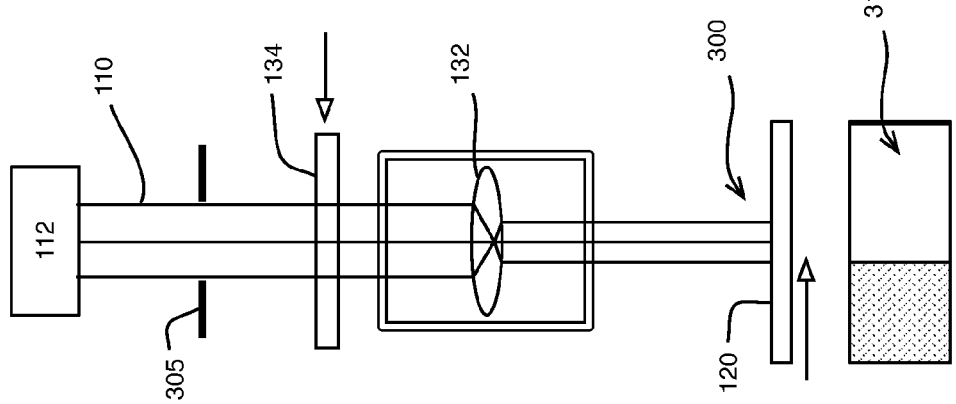
Figure 3B:
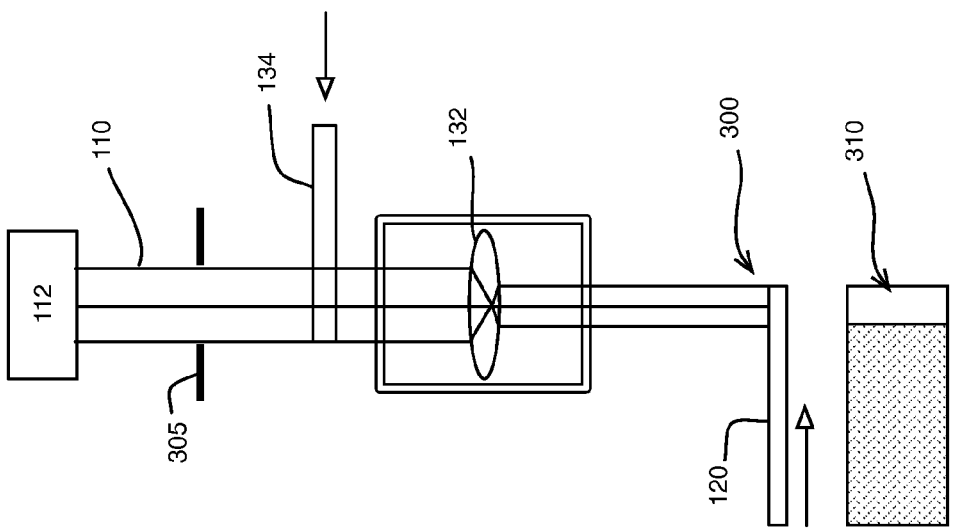

As shown in FIGS. 3B-3D, one or more of the mask 134, the objective arrangement 132, and the wafer 120 can be moved relative to each other during the exposure to scan the exposure window 300 across an exposure field 310. The exposure field 310 is the area of the wafer 120 that is exposed in one scan of the exposure slit or window 300.

The method described below reads out data (such as the optical spectrum 200) from the measurement system 180 (such as the measurement system 180B) on a pulse-to-pulse basis (that is, for each pulse of the light beam 110), stores N optical spectra 200 of the light beam 110 (one spectrum for each pulse), and averages the stored optical spectra over the exposure slit 300 to estimate a spectral feature such as the bandwidth of the light beam 110. This permits the calculation of the spectral feature on a rolling basis, that is, as the exposure field 310 is scanned across the slit 300, and the moving average across the slit 300 can therefore be reported out on a pulse-to-pulse basis. Moreover, if the wavelength is changing during the exposure (which can happen due to the disturbances 107 or because of commands from the control system 185 to change a target center wavelength, for example, to compensate for focus errors in the image plane due to thermal effects, wafer flatness, etc.), the effect of the wavelength change can be reduced or canceled out by applying a shift to the measured spectrum that corresponds to and offsets the effect of the wavelength change before calculating the average value of the spectral feature.

Before providing details about the method of estimating the spectral feature of the light beam 110, a general description of the photolithography system 100 is provided first for background.

Figure 4:
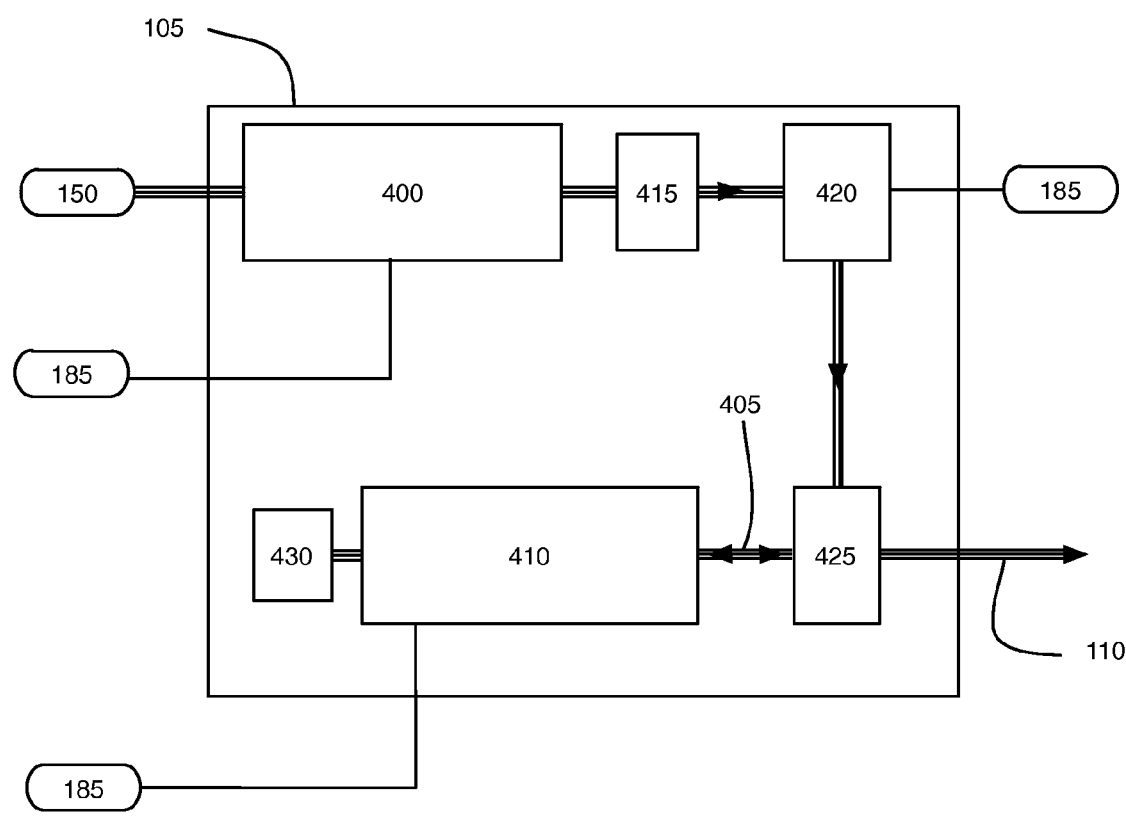
FIG. 4 is a block diagram of an exemplary optical source that can be used in the photolithography system of FIG. 1.

Referring to FIG. 4, an exemplary optical source 105 is a pulsed laser source that produces as the light beam 110 a pulsed laser beam. As shown in the example of FIG. 4, the optical source 105 is a two-stage laser system that includes a master oscillator (MO) 400 that provides a seed light beam 405 to a power amplifier (PA) 410. The master oscillator 400 typically includes a gain medium in which amplification occurs and an optical feedback mechanism such as an optical resonator. The power amplifier 410 typically includes a gain medium in which amplification occurs when seeded with the seed laser beam from the master oscillator 400. If the power amplifier 410 is designed as a regenerative ring resonator then it is described as a power ring amplifier (PRA) and in this case, enough optical feedback can be provided from the ring design. The master oscillator 400 enables fine tuning of spectral parameters such as the center wavelength and the bandwidth at relatively low output pulse energies. The power amplifier 410 receives the output from the master oscillator 400 and amplifies this output to attain the necessary powers for output to use in photolithography.

The master oscillator 400 includes a discharge chamber having two elongated electrodes, a laser gas that serves as the gain medium, a fan for circulating the gas between the electrodes, and a laser resonator is formed between the spectral feature selection system 150 on one side of the discharge chamber and an output coupler 415 on a second side of the discharge chamber. The optical source 105 can also include a line center analysis module (LAM) 420 that receives an output from the output coupler 415, and one or more beam modification optical systems 425 that modify the size and/or shape of the laser beam as needed. The line center analysis module 420 is an example of one type of measurement system 180A that can be used to measure the wavelength (for example, the center wavelength) of the seed light beam 405. The laser gas used in the discharge chamber can be any suitable gas for producing a laser beam around the required wavelengths and bandwidth, for example, the laser gas can be argon fluoride (ArF), which emits light at a wavelength of about 193 nm, or krypton fluoride (KrF), which emits light at a wavelength of about 248 nm.

The power amplifier 410 includes a power amplifier discharge chamber, and if it is a regenerative ring amplifier, the power amplifier also includes a beam reflector 430 that reflects the light beam back into the discharge chamber to form a circulating path. The power amplifier discharge chamber includes a pair of elongated electrodes, a laser gas that serves as the gain medium, and a fan for circulating the gas between the electrodes. The seed light beam 405 is amplified by repeatedly passing through the power amplifier. The beam modification optical system 425 provides a way (for example, a partially-reflecting mirror) to in-couple the seed light beam and to out-couple a portion of the amplified radiation from the power amplifier to form the output light beam 110.

One of the measurement systems 180A can be the line center analysis module 420, which monitors the wavelength of the output of the master oscillator 400. The line center analysis module can be placed at other locations within the optical source 105, or it can be placed at the output of the optical source 105.

Another of the measurement systems 180B can be placed at the output of the optical source 105, and this measurement system 180B is used to produce a baseline optical spectrum of the light beam 110. The measurement system 180B can be within the optical source 105 or at other locations. The other measurement system 180C can be an energy monitor that measures a pulse energy of the light beam 110 before it enters the lithography exposure apparatus 115. The energy monitor 180C can be a photo-diode module.

In some implementations, the measurement system 180B can include a grating spectrometer such as the ELIAS echelle spectrometer produced by LTB Lasertechnik Berlin GmbH, of Berlin, Germany. In the grating spectrometer, the light beam 110 is directed toward an echelle grating, which separates or disperses the light according to its wavelength, and the light beam 110 reflected from the grating is directed to a camera such as a charge coupled device camera, which is able to resolve the wavelength distribution of the light beam 110. Such a grating spectrometer can be used for system qualification and in research roles in which very fine details of the spectral shape and the energy distribution, including in-band energies and out-of-band energies, need to be accurately characterized in terms of bandwidth. Typically, grating spectrometers are not practical for onboard, real-time measurement of spectral properties such as the bandwidth in lithography applications.

Figure 5:
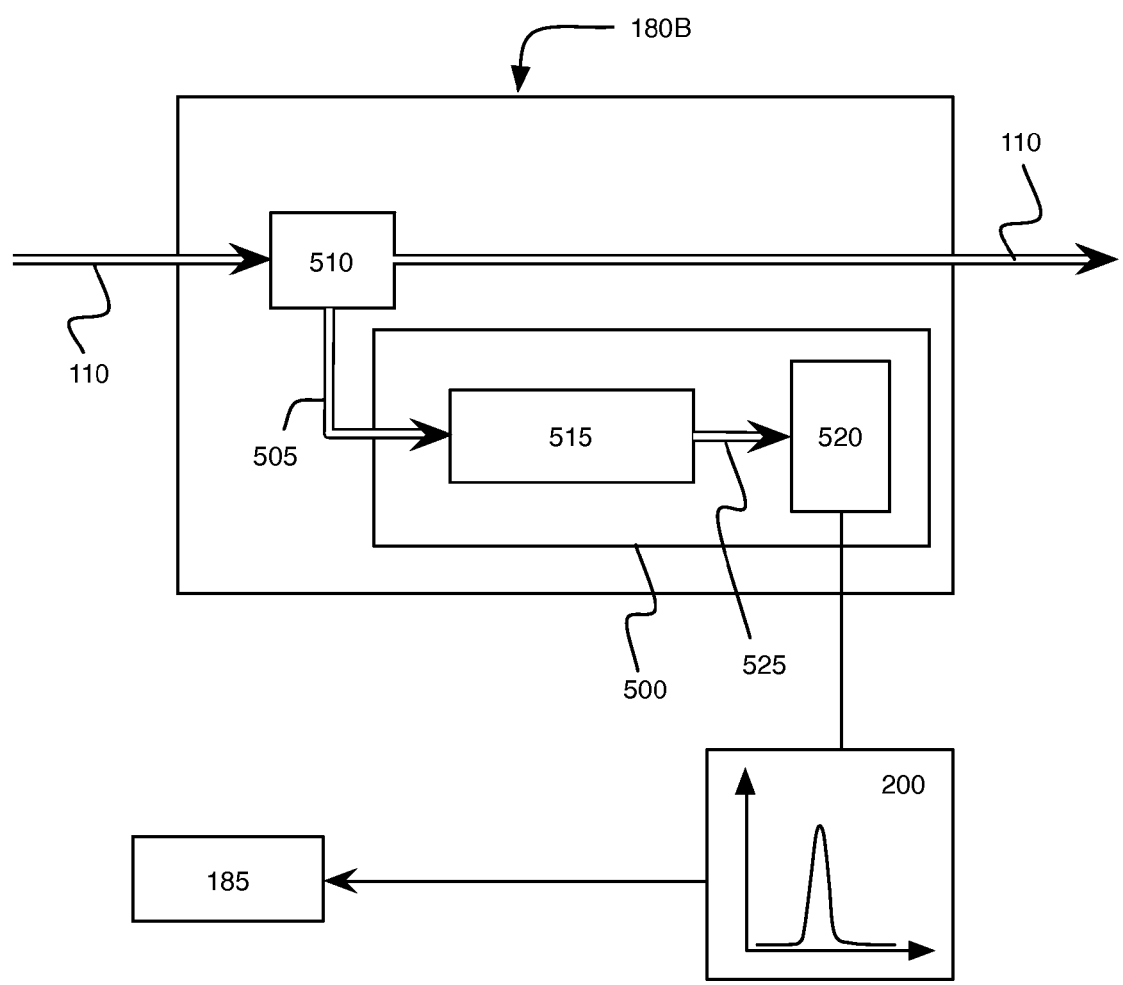
FIG. 5 is a block diagram of an exemplary measurement system of the photolithography system of FIG. 1.

Thus, as shown in FIG. 5, another exemplary measurement system 180B that can be used for onboard, real-time measurement of spectral properties includes an etalon spectrometer 500 that receives a portion 505 of the light beam 110 that is redirected from a beam splitting device 510 placed along the path of the light beam 110. The etalon spectrometer 500 includes an optical arrangement 515 through which the light beam portion 505 travels, and a detector 520 that receives the output light 525 from the optical arrangement 515. The output of the detector 520 is connected to the control system 185; in this way, the control system 185 receives each optical spectrum 200 recorded by the detector 520 and performs a method to estimate the spectral feature of the pulsed light beam 110 based on one or more of the received optical spectra 200, as discussed in detail below.

Figure 6:
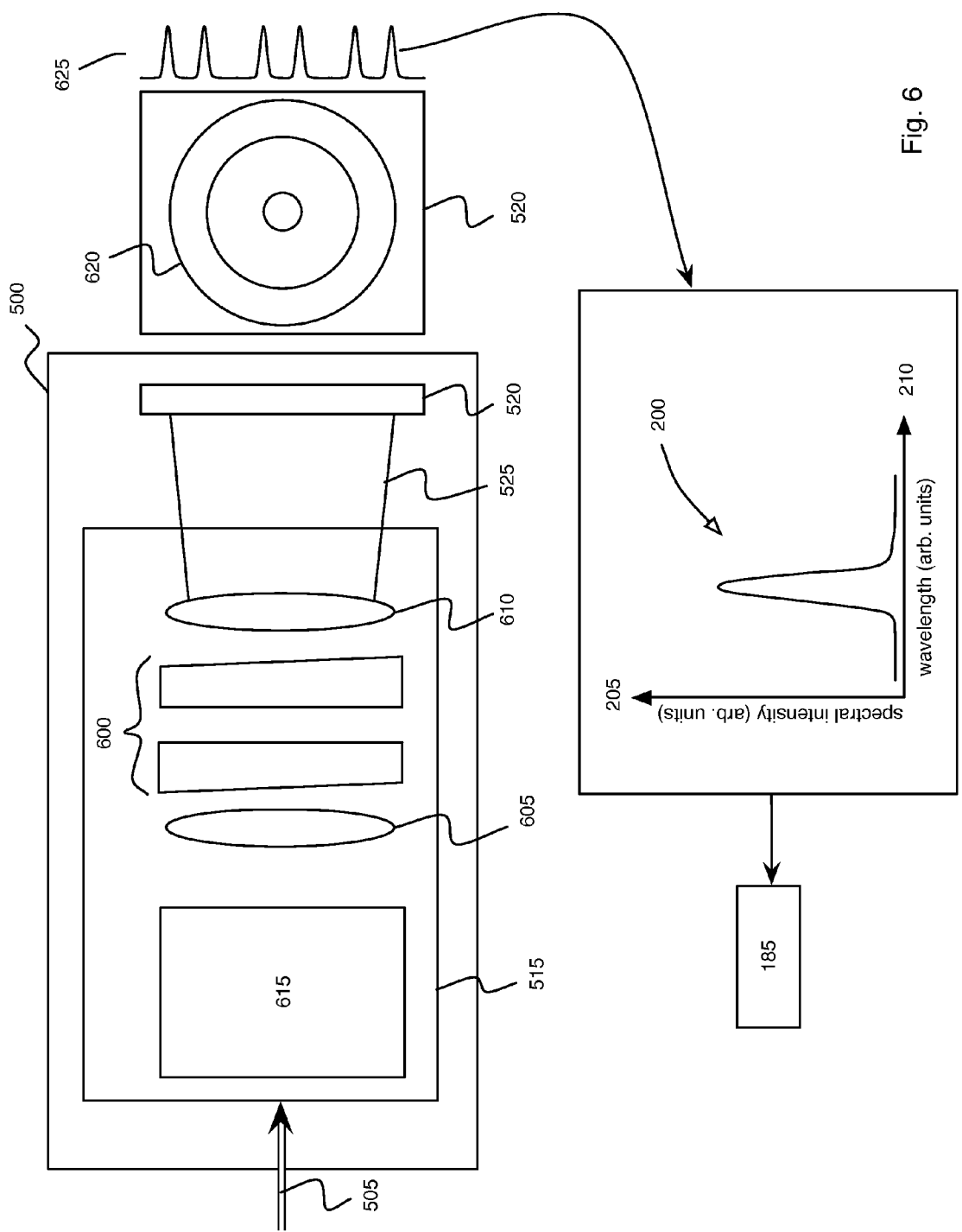
FIG. 6 is a block diagram of an exemplary etalon spectrometer that can be used in the measurement system of FIG. 5.

Referring to FIG. 6, an exemplary etalon spectrometer 500 is shown. The optical arrangement 515 includes an etalon 600, lenses 605, 610, and optional additional optics 615 such as an illuminator that includes a homogenizer (for example, a stationary, moving, or rotating diffuser) that homogenizes the beam. The illuminator can also generate a diverging beam where any part of the original beam is spread into the same range of angles equally. In some implementations, the etalon 600 includes a pair of partially reflective glass or optical flats, which can be spaced a short distance (for example, millimeters to centimeters) apart, with the reflective surfaces facing each other. In other implementations, the etalon 600 includes a single plate with two parallel reflecting surfaces. The flats can be made in a wedge shape (which is shown in FIG. 6) to prevent the rear surfaces from producing interference fringes; the rear surfaces often also have an anti-reflective coating. As the light beam portion 505 passes through the paired flats, it is multiply reflected, and produces a plurality of transmitted rays, which are collected by the lens 610 and brought to the detector 520. The complete interference pattern takes the appearance of a set of concentric rings 620 at the detector 520 if the light beam portion 505 is a diverging or a converging beam. The interference pattern is more or less of uniform intensity distribution at the detector 520 if the light beam portion 505 is a collimated beam. The sharpness of the rings depends on the reflectivity of the flats; if the reflectivity is high, resulting in a high Q factor, monochromatic light produces a set of narrow bright rings against a dark background. The transmission of the etalon 600 as a function of wavelength is shown in the resulting fringe pattern 625, which produces the optical spectrum 200, which is directed to the control system 185. While the complete interference pattern is shown, it is not needed to perform the calculations or estimates; it is alternatively possible to generate only fringes within a region that is slightly larger than an active area of the detector 520.

Figure 7A:
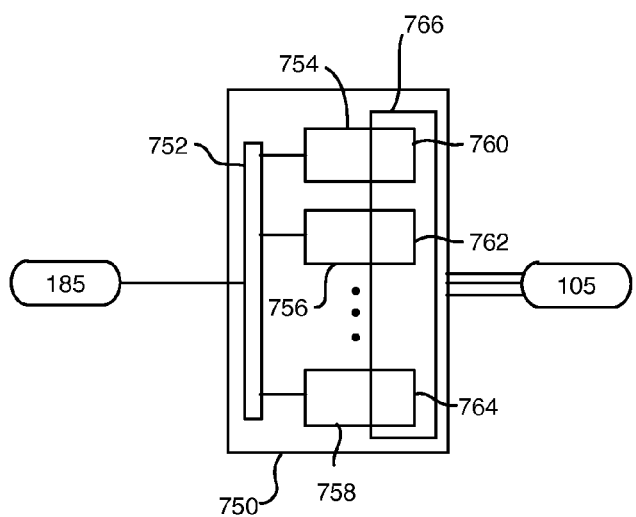
FIGS. 7A and 7B are block diagrams of exemplary spectral feature selection systems that can be used in the photolithography system of FIG. 1 to control spectral features of the light beam produced by the optical source.

Referring to FIG. 7A, an exemplary spectral feature selection system 750 is shown that couples to light from the optical source 105. In some implementations, the spectral feature selection system 750 receives the light from the master oscillator 400 to enable the fine tuning of the spectral features such as wavelength and bandwidth within the master oscillator 400.

The spectral feature selection system 750 can include a control module such as spectral feature control module 752 that includes electronics in the form of any combination of firmware and software. The module 752 is connected to one or more actuation systems such as spectral feature actuation systems 754, 756, 758. Each of the actuation systems 754, 756, 758 can include one or more actuators that are connected to respective optical features 760, 762, 764 of an optical system 766. The optical features 760, 762, 764 are configured to adjust particular characteristics of the generated light beam 110 to thereby adjust the spectral feature of the light beam 110. The control module 752 receives a control signal from the control system 185, the control signal including specific commands to operate or control one or more of the actuation systems 754, 756, 758. The actuation systems 754, 756, 758 can be selected and designed to work together, that is, in tandem. Moreover, each of the actuation systems 754, 756, 758 can be optimized to respond to a particular class of disturbances 107.

Together, such coordination and cooperation can be employed by the control system 185 to hold or maintain one or more spectral features (such as the wavelength or bandwidth) at a desired setpoint or at least within a desired range around a setpoint, even though the optical source 105 may be subjected to a wide array of disturbances 107. Alternatively, such coordination and cooperation can be employed by the control system 185 to modify the spectral feature (such as the wavelength or the bandwidth) during exposure to match some predefined trajectory so that modulation of the spectral feature can compensate for a non-optimum aspect of the exposure process, such as, for example, a lack of flatness of the wafer 120 at its edges, as discussed below in greater detail.

Figure 7B:
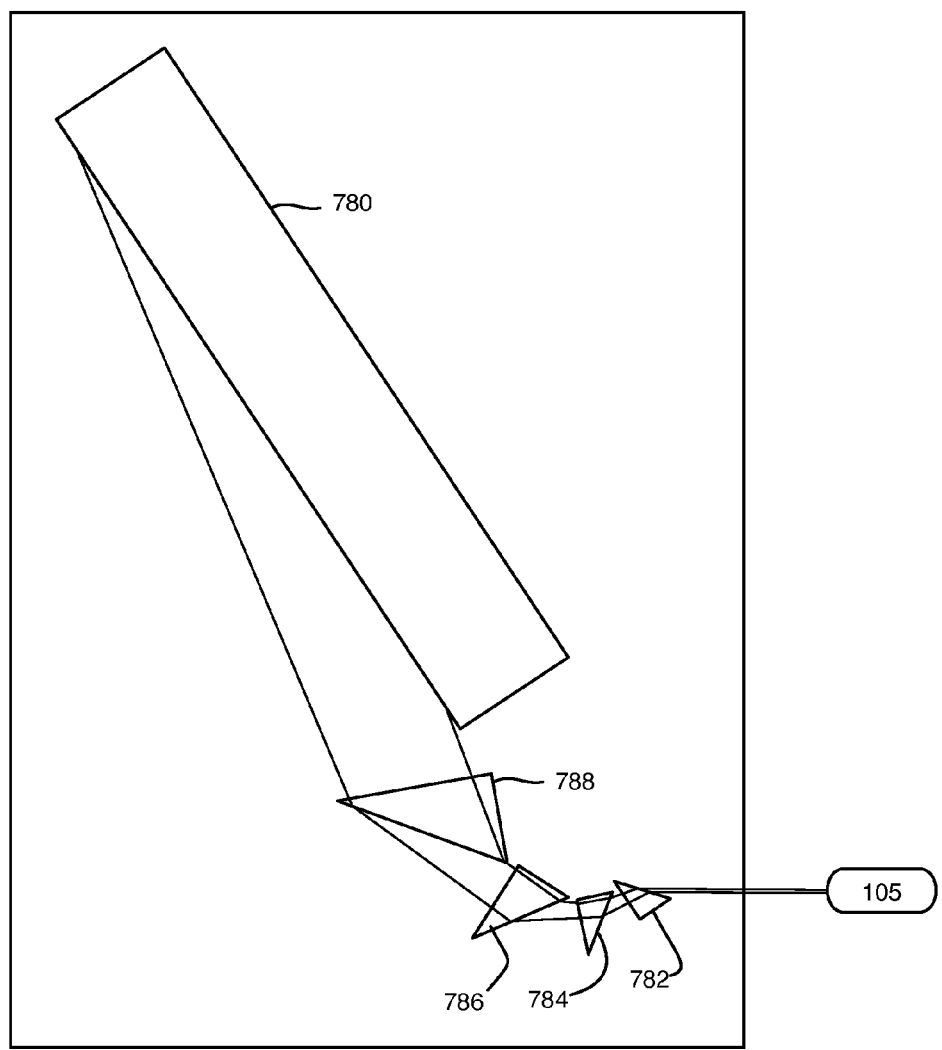

Each optical feature 760, 762, 764 is optically coupled to the light beam 110 produced by the optical source 105. In some implementations, the optical system 766 is a line narrowing module such as that shown in FIG. 7B. The line narrowing module includes as the optical features 760, 762, 764 dispersive optical elements such as reflective gratings 780 and refractive optical elements such as prisms 782, 784, 786, 788, one or more of which can be rotatable. An example of this line narrowing module can be found in U.S. application Ser. No. 12/605,306, entitled "System Method and Apparatus for Selecting and Controlling Light Source Bandwidth," and filed on Oct. 23, 2009 (the '306 application), which is incorporated herein by reference in its entirety. In the '306 application, a line narrowing module is described that includes a beam expander (including the one or more prisms 782, 784, 786, 788) and the dispersive element such as the grating 780. The respective actuation systems for the actuatable optical features such as the grating 780, and one or more of the prisms 782, 784, 786, 788 are not shown in FIG. 7B.

Each of the actuators of the actuation systems 754, 756, 758 is a mechanical device for moving or controlling the respective optical features 760, 762, 764 of the optical system 766. The actuators receive energy from the module 752, and convert that energy into some kind of motion imparted to the optical features 760, 762, 764 of the optical system. For example, in the '306 application, actuation systems are described such as force devices (to apply forces to regions of the grating) and rotation stages for rotating one or more of the prisms of the beam expander. The actuation systems 754, 756, 758 can include, for example, motors such as stepper motors, valves, pressure-controlled devices, piezoelectric devices, linear motors, hydraulic actuators, voice coils, etc.

Figure 8A:
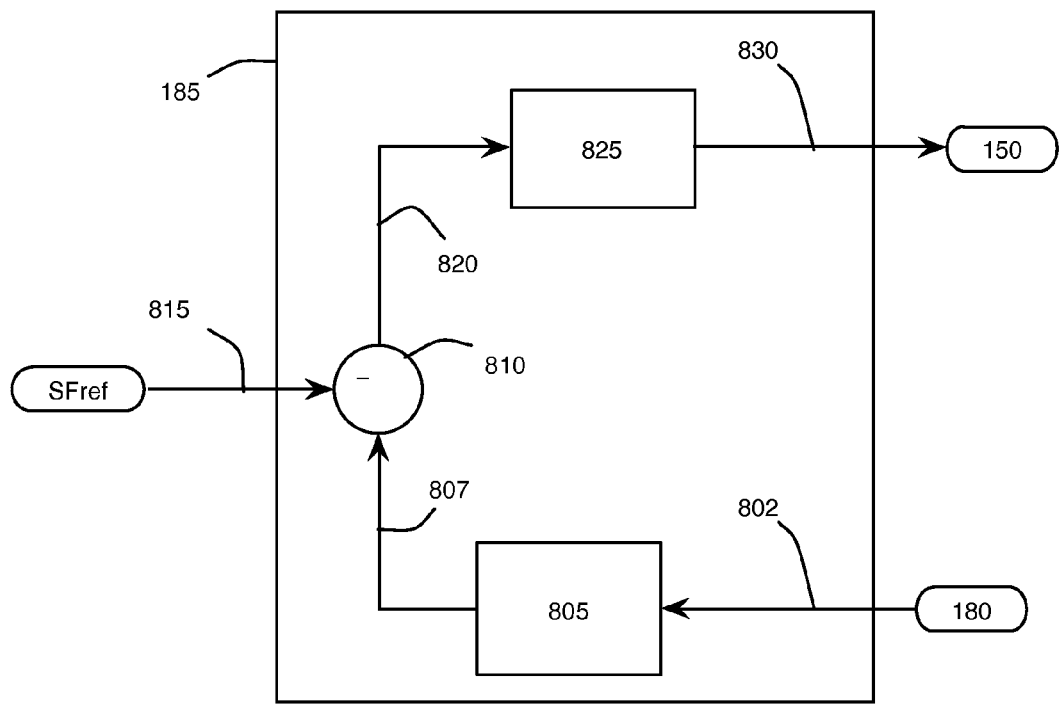
FIG. 8A is a block diagram of an exemplary control system of the photolithography system of FIG. 1.

Referring to FIG. 8A, the control system 185 generally includes one or more of digital electronic circuitry, computer hardware, firmware, and software. The control system 185 can also include appropriate input and output devices, one or more programmable processors, and one or more computer program products tangibly embodied in a machine-readable storage device for execution by a programmable processor. The one or more programmable processors can each execute a program of instructions to perform desired functions by operating on input data and generating appropriate output. Generally, the processor receives instructions and data from a read-only memory and/or a random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, specially designed ASICs (application-specific integrated circuits).

In general, the control system 185 receives information about the light beam 110 from the optical source 105 and from the measurement systems 180A, 180B, 180C, and performs an analysis on the information to determine how to adjust one or more spectral features (for example, the bandwidth) of the light beam 110 supplied to the lithography exposure apparatus 115. Based on this determination, the control system 185 sends signals to the spectral feature selection system 150 and/or the optical source 105 to control operation of the optical source 105.

To this end, the control system 185 includes a spectral feature estimator 805 that receives measurement data 802 from the one or more measurements systems 180A, 180B, 180C (such as the measurement system 180B). In general, the spectral feature estimator 805 performs all of the analysis needed to estimate the spectral feature (for example, the bandwidth) of the light beam 110, and in particular, on a pulse-to-pulse basis. The output of the spectral feature estimator 805 is an estimated value 807 of the spectral feature.

Figure 8B:
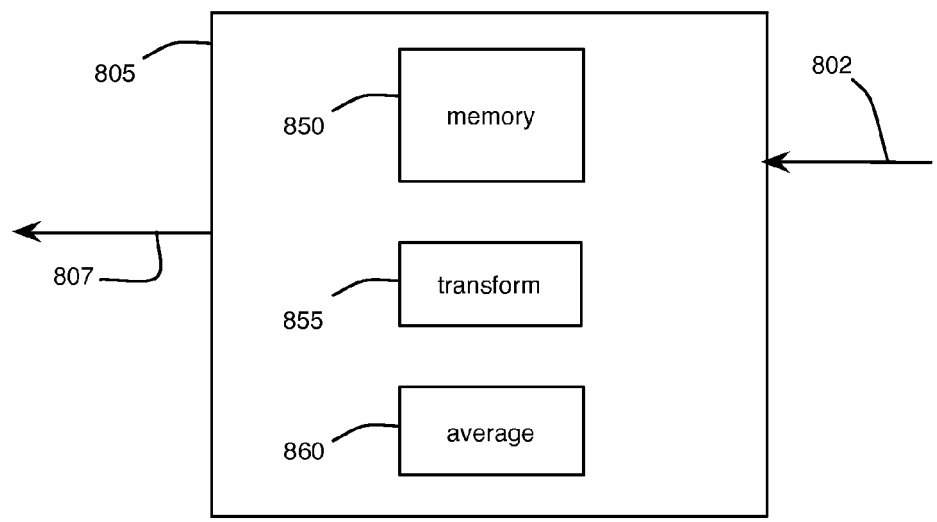
FIG. 8B is a block diagram of an exemplary spectral feature estimator within the control system of FIG. 8A.

Referring also to FIG. 8B, the spectral feature estimator 805 includes memory 850 for storing, for example, the optical spectra 200 received from the measurement system 180B. The memory 850 can store as many optical spectra 200 as needed to perform the analysis on the data and determine the spectral feature. The spectral feature estimator 805 also includes a transforming block 855 that accesses the stored optical spectra 200 within memory 850 and modifies the optical spectra 200 as needed to account for changes in the wavelength of the light beam 110, along with other possible changes that can impact the shape and position of the optical spectrum 200. The spectral feature estimator 805 includes an averaging block 860 that averages a set of the optical spectra 200 that have been transformed by the transforming block 855.

The control system 185 includes a comparison block 810 connected to the estimated value 807 output from the spectral feature estimator 805 and to a spectral feature target value 815. In general, the comparison block 810 outputs a spectral feature error value 820 that represents a difference between the spectral feature target value 815 and the estimated value 807, and the spectral feature error value 820 is directed to a spectral feature actuation apparatus 825. In general, the spectral feature actuation apparatus 825 determines how to adjust the spectral feature selection system 150 based on the spectral feature error value 820, and the output of the spectral feature actuation apparatus 825 includes a set of actuator commands 830 that are sent to the spectral feature selection system 150.

The spectral feature actuation apparatus 825 can include an estimator that stores or accesses calibration data for the various actuators that are within the spectral feature selection system 150. For example, calibration data for a bandwidth control device, a piezoelectric device, or a differential timing system can be stored and/or accessed by the estimator. The estimator receives the spectral feature error value 820 and determines one or more of the actuator commands 830. The spectral feature actuation apparatus 825 includes one or more spectral feature controllers that receive the one or more actuator commands 830 and determine how the actuator commands can be applied to the various actuators of the spectral feature selection system 150. For example, the spectral feature actuation apparatus 825 can include a wavelength controller that determines how to adjust the wavelength of the light beam, and thus, how to actuate the devices in the spectral feature selection system 750 shown in FIGS. 7A and 7B.

Figure 9:
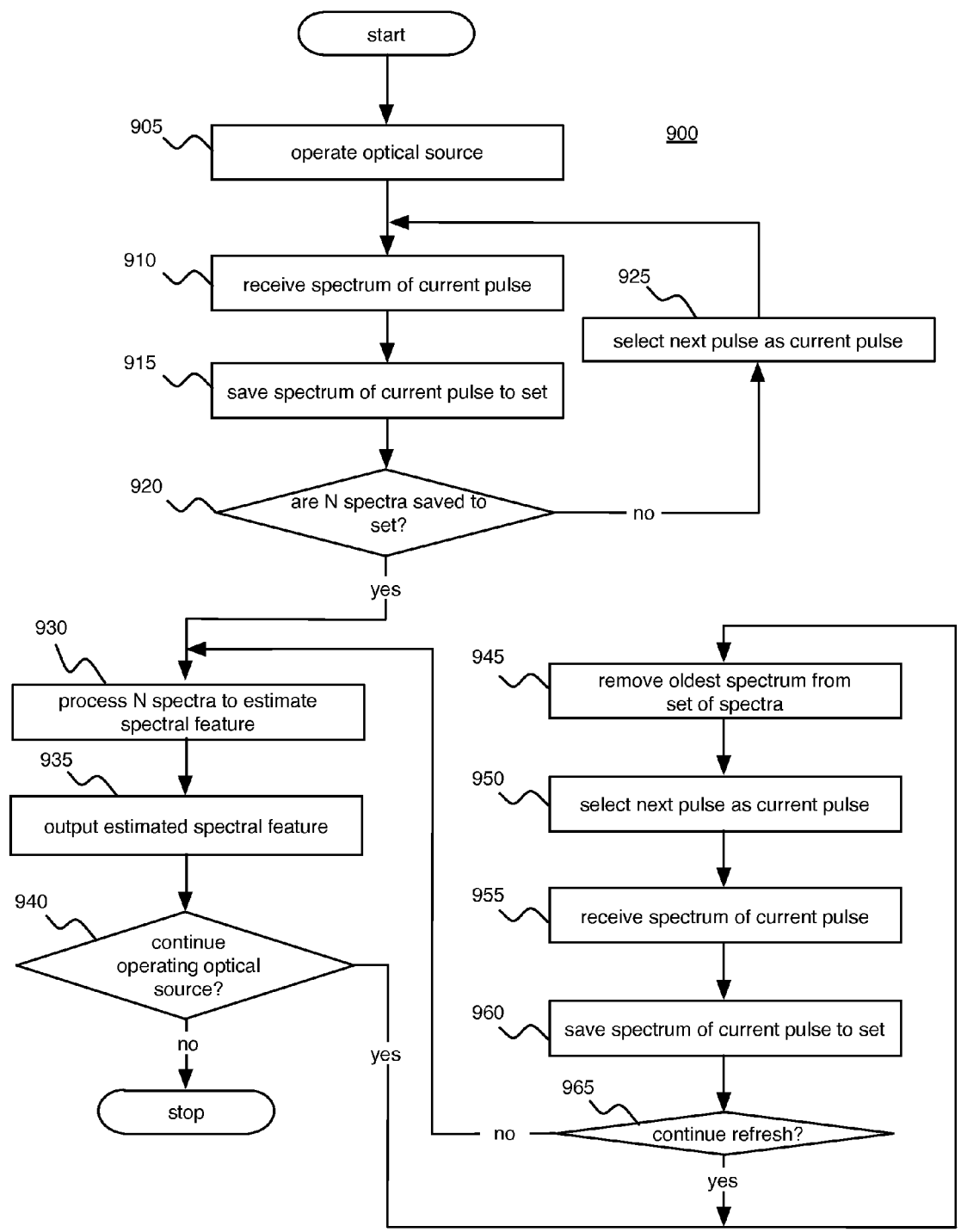
FIG. 9 is a flow chart of a procedure performed by the photolithography system of FIG. 1 to estimate a spectral feature of the light beam produced by the optical source.

Referring to FIG. 9, a procedure 900 is performed by the photolithography system 100 (and in particular, the control system 185) to estimate a spectral feature (such as bandwidth) of a pulsed light beam 110 produced by the optical source 105 while the pulsed light beam 110 is directed to the lithography exposure apparatus 115. The control system 185 operates the optical source 105 so that the pulsed light beam 110 is produced and directed to the exposure apparatus 115 (905). While the pulsed light beam 110 is being directed to the exposure apparatus 115, the control system 185 receives the optical spectrum 200 of the current pulse (910) from the measurement system 180B. The control system 185 saves the received optical spectrum 200 to memory 850 (915). For example, with reference to FIGS. 8A and 8B, the spectral feature estimator 805 saves the received optical spectrum 200 to memory 850.

The control system 185 determines whether a pre-set number of spectra 200 have been saved to memory 850 (920) to provide enough data to perform an analysis on the spectra 200 to determine a valid, reproducible value for the spectral feature. For example, the pre-set number of spectra 200 can be based on the number of pulses N of the light beam 110 that illuminate the slit 300. Thus, the control system 185 can determine whether there are N spectra 200 saved to memory 850 (920), with each spectrum saved corresponding to a specific pulse of the light beam 110. If the control system 185 determines that fewer than the pre-set number of spectra 200 are saved to memory 850 (920), then the control system 185 selects the next pulse of the light beam 110 as the current pulse (925) and proceeds to receive the optical spectrum 200 of the current pulse (910) from the measurement system 180B and save the received optical spectrum 200 to memory 850 (915).

Figure 10:
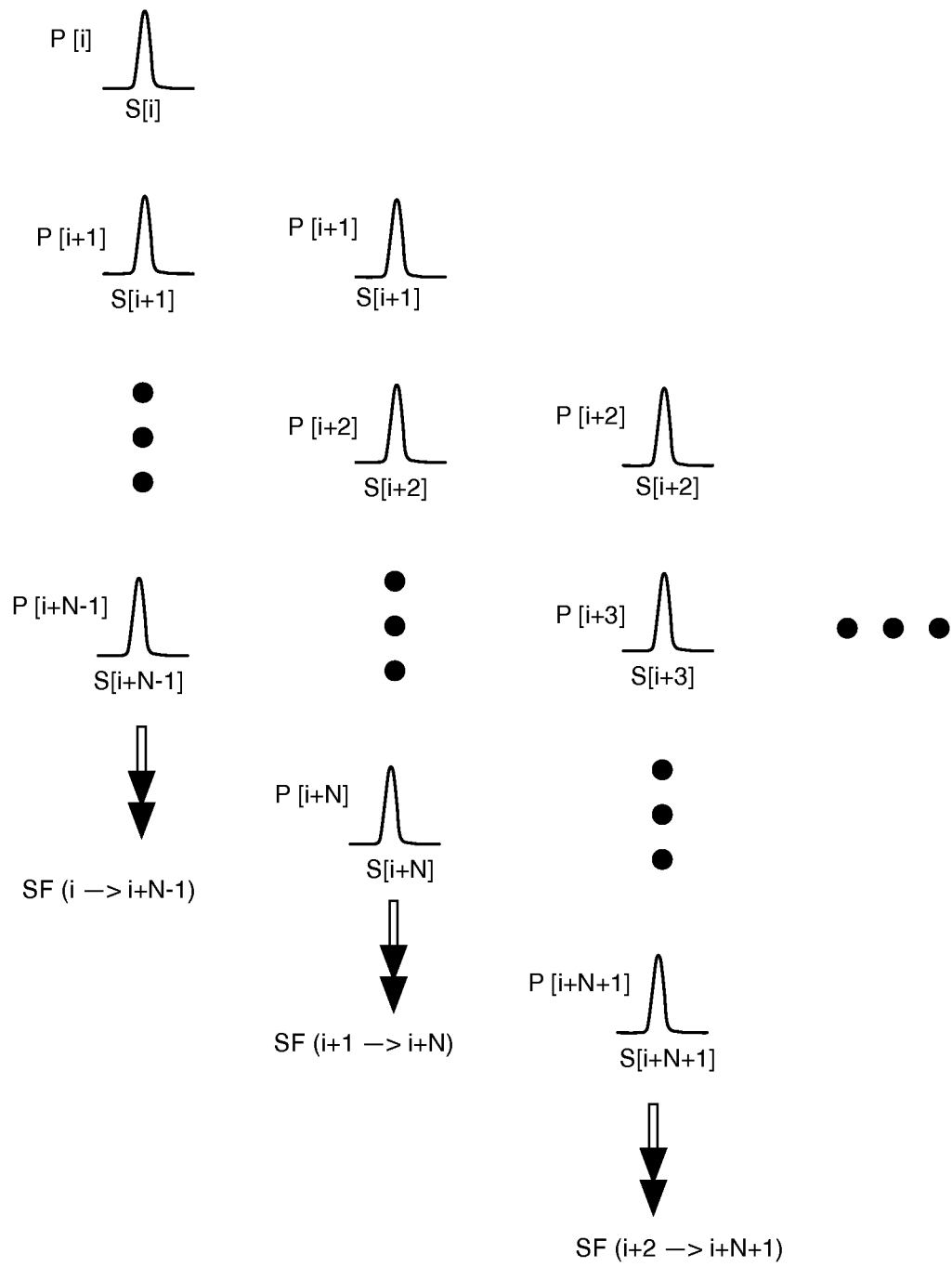
FIG. 10 is a schematic diagram showing an exemplary sequence of pulses produced by the optical source of FIG. 1.

As an example of these steps in the procedure 900, reference is made to the schematic shown in FIG. 10. As the first pulse P[i] is set as the current pulse, the optical spectrum S[i] of the current pulse P[i] is received (910). Next, the control system 185 determines that N spectra have not yet been saved to memory 850 (920), so it selects the next pulse P[i+1] as the current pulse (925) and the spectrum S[i+1] of the current pulse P[i+1] is received (910). This proceeds until the control system 185 receives the spectrum S[i+N−1] of pulse P[i+N−1] (910) and saves the spectrum S[i+N−1] to memory 850 (915). Because the control system 185 determines that N spectra have been saved to memory 850 (920), the procedure 900 moves on to perform an analysis of the saved N spectra.

The first optical spectrum 200 to be saved to memory 850 (915) can correlate with the beginning of the exposure field or burst, and thus the number of saved spectra N can correspond to the total number of pulses N of the light beam 110 that illuminate the slit 300.

Turning back to FIG. 9, if the control system 185 determines that N spectra 200 are saved to memory 850 (920), the control system 185 processes the saved N spectra 200 to estimate the spectral feature (930). For example, with reference to FIGS. 8A and 8B, the transforming block 855 and the averaging block 860 of the spectral feature estimator 805 perform processing of the data within memory 850. The control system 185 outputs the estimated spectral feature (935). For example, with reference to FIGS. 8A and 8B, the spectral feature estimator 805 outputs the estimated value 807 of the spectral feature.

If the control system 185 determines that the optical source 105 should continue to be operated (940), then the control system 185 performs a fringe buffer refresh sub-process that starts with removing the oldest spectrum from the set of saved spectra within memory 850 (945), and selecting the next pulse as the current pulse (950). With reference to the example of FIG. 10, the oldest pulse P[i] is removed from memory 850 (945) and the next pulse P[i+N] is selected as the current pulse (950). The control system 185 receives the spectrum 200 of the current pulse (955) and saves the spectrum 200 of the current pulse to the set of spectra within memory 850 (960). With reference to the example of FIG. 10, the spectrum S[i+N] for the pulse P[i+N] is received (955) and saved to memory 850 (960). In some implementations, the spectrum 200 of the current pulse may only be saved to the set of spectra within memory 850 (960) if the spectrum 200 passes a quality test. In this case, if the spectrum 200 does not pass the quality test, then steps 950-960 of the sub-process are repeated.

The control system 185 determines whether the fringe buffer refresh sub-process should be continued (that is, whether additional pulses are to be removed and added before performing the analysis on the set of saved spectra 200) (965). If additional pulses need to be removed and added, then the control system 185 repeats the sub-process by removing the oldest spectrum from the set of saved spectra within memory 850 (945), selecting the next pulse as the current pulse (950), receiving the spectrum 200 of the current pulse (955), and saving the spectrum 200 of the current pulse to the set of saved spectra in memory 850 (960). Thus, for example, with reference to the example of FIG. 10, the oldest pulse P[i+1] is removed from memory 850 (945), the next pulse P[i+N+1] is selected as the current pulse (950), the spectrum S[i+N+1] of the current pulse P[i+N+1] is received (955) and saved to memory 850 (960).

If the control system 185 determines that additional pulses do not need to be removed and added before performing the analysis on the set of saved spectra 200 (965), then the control system 185 processes the saved N spectra 200 to estimate the spectral feature (930), and then outputs the estimated spectral feature (935).

Figure 11:
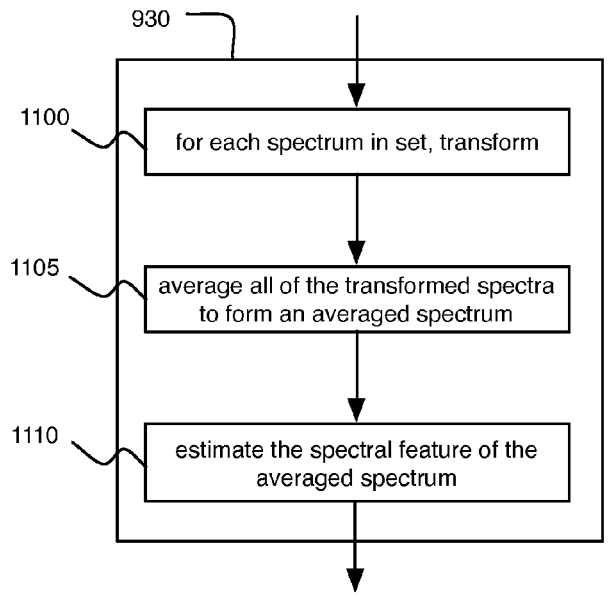
FIG. 11 is a flow chart of a procedure for processing saved optical spectra to estimate a spectral feature of the light beam produced by the optical source.
Figure 12:
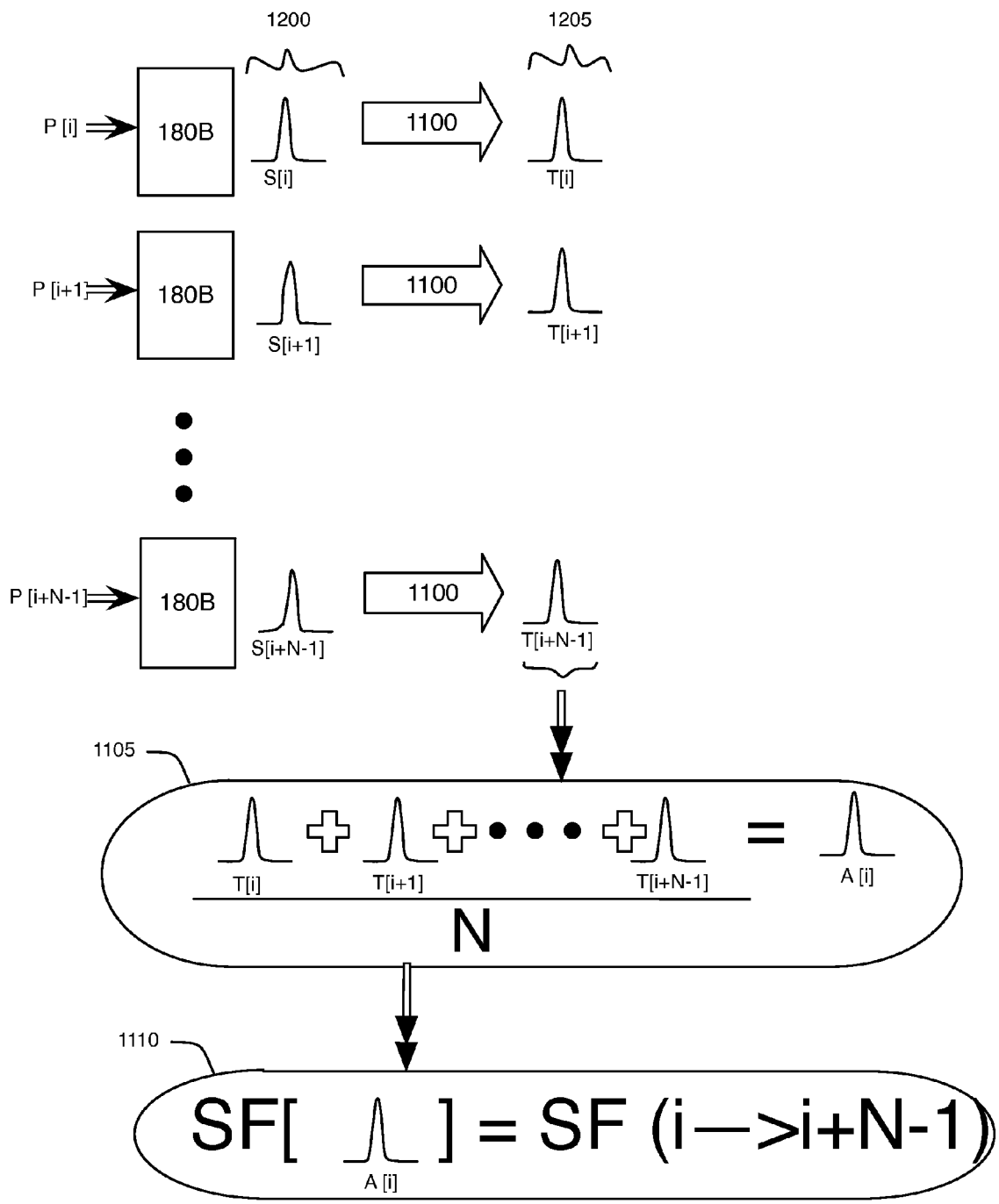
FIG. 12 is a schematic diagram illustrating how the saved optical spectra are processed to estimate the spectral feature of the light beam produced by the optical source in accordance with the procedure of FIG. 11.

Referring to FIG. 11, the control system 185 performs a procedure 930 for processing the saved N spectra 200 to estimate the spectral feature. Reference is also made to FIG. 12, which shows an illustration of a set of saved optical spectra {S[i], S[i+1], . . . S[i+N−1]} 1200 that are produced by a set of N pulses {P[i], P[i+1], . . . P[i+N−1]} detected by the measurement system 180B.

The control system 185 transforms (for example, shifts, scales, etc., as described below) each optical spectrum S in the saved set 1200 to form a set of transformed optical spectra T 1205 (1100). After the optical spectra are transformed (1100) into the set of transformed optical spectra T 1205, the control system 185 averages the transformed optical spectra T 1205 to form an averaged spectrum A[i] (1105); and estimates a metric value of the averaged spectrum to characterize a spectral feature SF of the pulsed light beam based on the averaged spectrum A[i] (1110).

Figure 13:
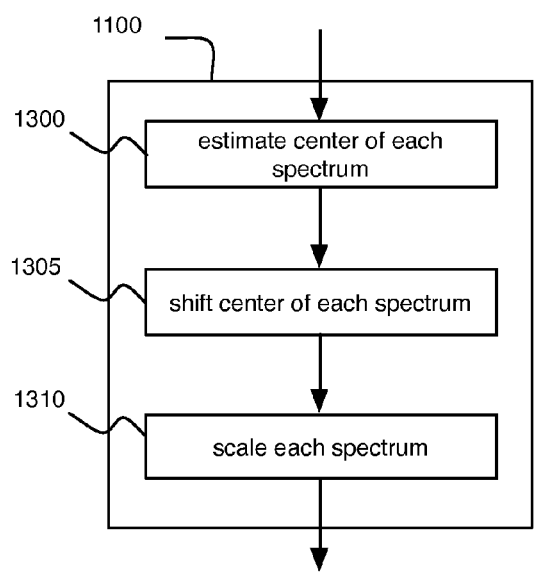
FIG. 13 is a flow chart of a procedure for transforming each saved optical spectrum to form a set of transformed optical spectra.

Referring also to FIG. 13, in some implementations, the control system 185 performs a procedure 1100 to transform each optical spectrum S in the saved set 1200 to form a set of transformed optical spectra T 1205. Reference is made to FIGS. 14A-14C to illustrate the steps in the procedure 1100. In this example, the control system 185 estimates a center C or {C[i], C[i+1], . . . C[i+N−1]} of each optical spectrum S in the saved set 1200 (1300), and shifts or moves each optical spectrum S in the saved set 1200 along the wavelength (or frequency) axis so that each of the centers {C[i], C[i+1], . . . C[i+N−1]} of the optical spectra S aligns with the other centers (1305).

This can be done by, for example, selecting one of the centers in the set as the alignment center $C_{AL}$ and aligning the other centers in the set with the selected center $C_{AL}$. Or, as another example, all of the centers {C[i], C[i+1], . . . C[i+N−1]} can be aligned with a pre-defined location on the wavelength or frequency axis.

More specifically, the wavelength of the light beam 110 can change while the optical spectra S is received and stored in memory 850, and the change in wavelength will show up in the amount that each optical spectrum is offset from a center value, and thus, by shifting the optical spectra S in the sets, the control system 185 can compensate for or cancel out the effect of the changing wavelength. The optical spectrum S that is received and stored can also depend on a wavelength dependent spectral profile that depends on the design of the etalon spectrometer 500, and thus this effect can also be canceled out or compensated for by shifting or aligning the centers C of the optical spectra S.

As another example, it is possible that during the operation of the optical source (905), the wavelength of the light beam 110 needs to be changed during the scanning across the exposure field 310. The procedure 900 can also include receiving a request to change the wavelength of the pulsed light beam 110 to a new wavelength. If this happens, then the procedure 1100 can also include shifting the optical spectra to align their centers {C[i], C[i+1], . . . C[i+N−1]} with the new wavelength.

The control system 185 may also scale each optical spectrum S by a scaling or weight factor F or {F[i], F[i+1], . . . F[i+N−1]} (1310) to obtain the transformed optical spectra {T[i], T[i+1], . . . T[i+N−1]} 1205 (shown in FIG. 14C). The scaling factor F for a particular transformed optical spectrum T can be dependent on how much the particular transformed optical spectrum T needs to be adjusted to match closely with the other transformed optical spectra in the set {T[i], T[i+1], . . . T[i+N−1]} to enable further processing in the next steps. Basically, each optical spectrum is multiplied by its respective scaling factor: {(F[i]×S[i]), (F[i+1]×S[i+1]), . . . (F[i+N−1]×S[i+N−1])} to obtain the transformed optical spectra {T[i], T[i+1], . . . T[i+N−1]}. In this example, the amplitude (spectral intensity or y axis) of the spectrum is scaled. In other implementations, it may be advantageous to scale the other axis (for example, the wavelength or frequency or x axis) of the spectrum. For example, in an etalon spectrometer, the wavelength (or frequency) may not be a linear function of position along the detector axis. Thus, pulses of equal bandwidth, but different center wavelengths (or frequency) can be different in width. For significant differences in wavelength (or frequency), it may be necessary to scale the horizontal axis (which includes scaling and interpolating to match up all the values along the horizontal axis) before adding/averaging the individual spectra.

In some implementations, the scaling factor F is proportional to an intensity distribution in the slit 300. For example, if the intensity distribution in the slit 300 is trapezoidal, then the scaling factor F by which each spectrum S is multiplied is given by this trapezoidal intensity variation. In practice, because the optical source 105 is pulsed, the trapezoidal intensity variation is sampled at equidistant points corresponding to the distance the wafer stage travels in between pulses to obtain an array of N scaling factors {F[i], F[i+1], . . . F[i+N−1]} with which each spectrum S is multiplied ("scaled") before being averaged.

Figure 15:
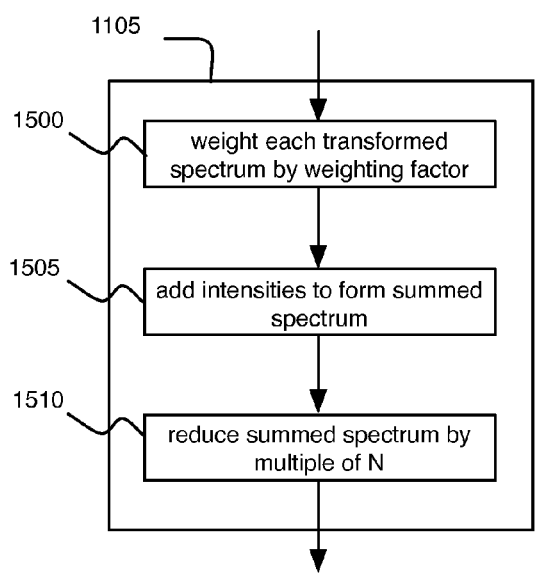
FIG. 15 is a flow chart of a procedure for averaging the transformed optical spectra to form an averaged spectrum.
Figure 16:
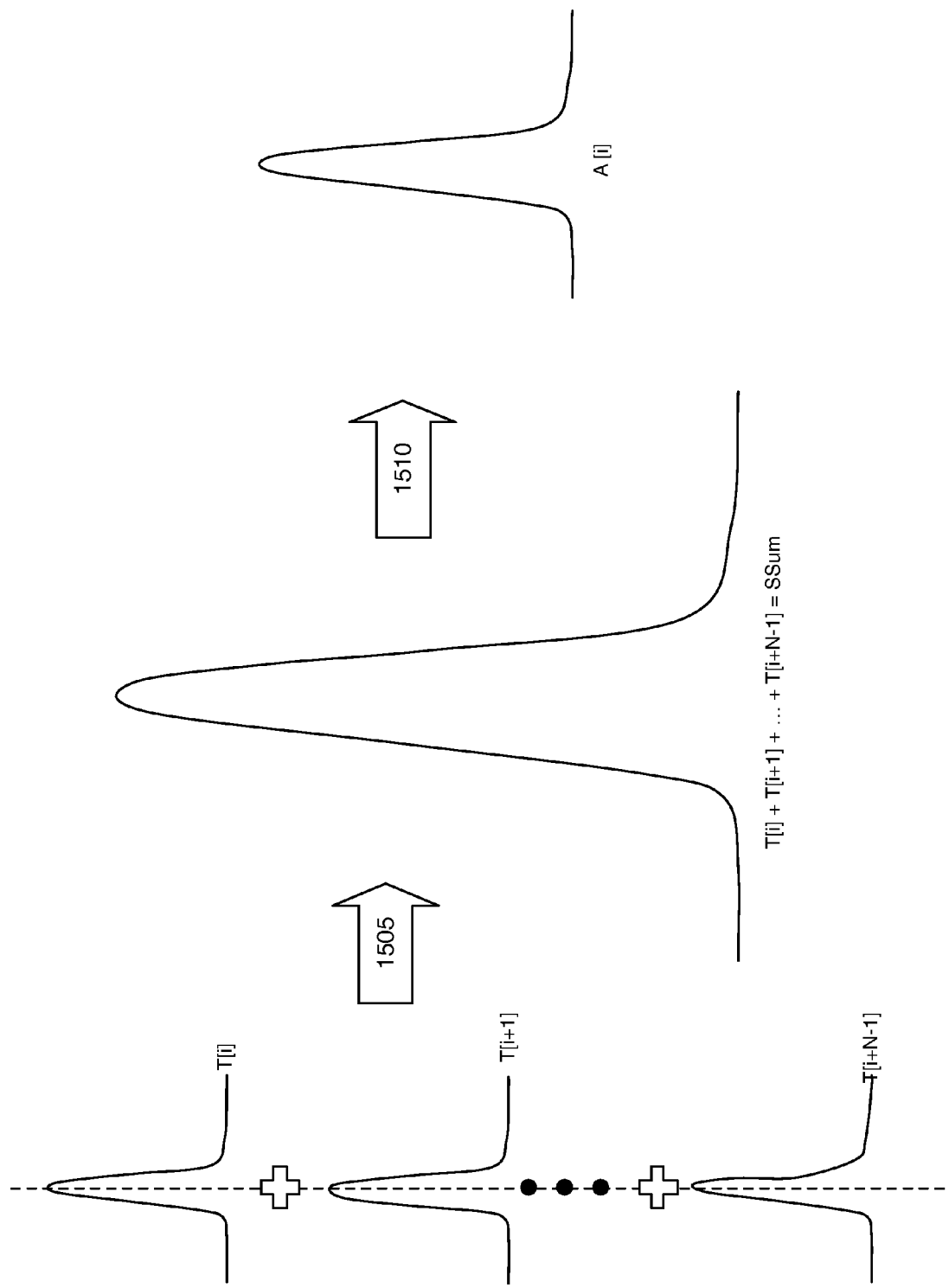
FIG. 16 is a schematic diagram illustrating how the transformed optical spectra are averaged to form the averaged spectrum in accordance with the procedure of FIG. 15.

Referring to FIG. 15, in some implementations, the control system 185 performs a procedure 1105 to average the transformed optical spectra {T[i], T[i+1], . . . T[i+N−1]} 1205 to form an averaged spectrum A[i]. Reference is also made to FIG. 16 to illustrate the steps in the procedure 1105. The control system 185 adds the intensities of each of the transformed optical spectra (T[i])+(T[i+1])+ . . . (T[i+N−1]) (1505) to form a summed spectrum SSum. Optionally, the control system 185 may reduce the summed spectrum SSum by a value that is a multiple of N (for example, by N, 2N, 3N, etc.) (1510) to obtain the averaged spectrum A[i].

As discussed above, the control system 185 estimates a metric value that characterizes the spectral feature SF of the pulsed light beam based on the averaged spectrum A[i] (1110). Because the averaged spectrum A[i] is obtained from a set of optical spectra S, and each optical spectrum S is a convolution of an actual source spectrum of the light beam 110 and an instrument function of the measurement system 180B, the averaged spectrum A[i] is a convolution of the actual source spectrum of the light beam 110 and an instrument function of the measurement system 180B. Thus, to obtain an estimate of the metric value that characterizes the spectral feature SF, one option is to deconvolve the source spectrum from the instrument function and then apply the metric to that deconvolved spectrum (for example, measure the width of the deconvolved spectrum that contains a fraction or percentage (Y) of the integrated spectral intensity (EY)). Deconvolution is often not practical because it can require a lot of processing time and energy. Thus, another option is to apply a mathematical model to the averaged spectrum A[i] that uses two or more widths of the averaged spectrum A[i], with each width being taken at a unique parameter value. For example, the first width could be a full width at 75 percent of the maximum intensity of the spectrum and the second width could be a full width at 25 percent of the maximum intensity of the spectrum. One example of a suitable model is as follows:

Esource=A·w(first parameter)+B·w(second parameter)+C, where Esource is the estimated metric value for the bandwidth (spectral feature) that represents a width of the averaged spectrum that contains a fraction or a percentage (Y) of the integrated spectral intensity (EY), A, B, and C are calibration constants determined by a fit of the spectrometer to the model, and w is the width. Other suitable models can be used.

The above-described procedure improves signal to noise and enables rapid measurement of the spectral feature to thereby account for shifts in wavelength during operation of the optical source 105; such wavelength shifts can be inadvertent or planned. The above-described procedure reduces the effect that speckle can have at the detector 520, such speckle being caused by the coherence of the light beam 110 that produces the speckle in the image plane. Moreover, the spectral feature (such as the bandwidth) can be updated to match the moving window (or slit) experience of the exposure at the wafer 120.

Because the procedure is so fast, it enables the continuous and dynamic adjustment of the spectral feature throughout the exposure of the wafer 120 to compensate for various effects that can impact the image quality at the wafer 120.

The contrast (or image contrast) defines how quickly, in spatial terms, the dose varies through a range of doses in which the resist may be removed (on the one hand) and in which the resist should remain (on the other hand). Thus, in some implementations, the image contrast is the difference in dose on the wafer that represents areas where the resist should be exposed to a relatively high dose (and, the resist should stay) and areas where the resist should be exposed to a relatively low dose (and, the resist should be removed). In other implementations, the image contrast is the difference in dose on the wafer that represents areas where the resist should be exposed to a relatively high dose (and, the resist should be removed) and areas where the resist should be exposed to a relatively low dose (and the resist should stay). In particular, there may be factors, such as stage vibrations, influencing contrast in the image other than the bandwidth of the light beam 110. Imaging of the physical features or patterns (for example, a width of a line, a size of a contact hole, or a position of a line end) that are printed on the wafer 120 depends very delicately on many factors and any variation of these factors can result in a disturbance of the feature to be printed. In practice, a plurality of patterns or features is printed on the wafer 120, and each pattern may have a different contrast, which can depend on the layout or geometry of the pattern. The size of the features varies accordingly with these factors. A measure for this variation is expressed in a quantity called Critical Dimension Uniformity (CDU), which quantifies the variation in size (for example, in units of nanometers) of a feature over the wafer. For a chipmaker, the CDU should be kept as low as technically (and economically) possible or at least its value should not exceed certain limits determined by the function of the device that is produced from the chip produced from the wafer 120.

One of the contributors in the budget for CDU is the bandwidth of the light beam 110. The bandwidth contribution can be understood as follows. Due to the inevitable chromatic aberrations of the projection lens which projects the image of the mask onto the wafer 120, the different spectral components that are characterized by the value of the bandwidth are focused at a slightly different height above or below the plane of the wafer 120 and thus the imaging is somewhat degraded from the case in which one would have a single monochromatic wave that is imaged perfectly on the wafer 120. In this sense, the effect of chromatic aberration can be compared, for example, to vibrations of the wafer stage 142 in which the wafer stage 142 moves up and down somewhat in or against the direction of the propagating light beam 110. That also results in a smearing of the image and consequently in a variation in critical dimension (CD) and results in an increase in CDU. Thus, CDU is affected by the bandwidth; higher bandwidth lowers the contrast and thus results in a higher CDU.

The contributions of other CDU contributors may vary across the wafer 120 or even across a single exposure field 310 on the wafer 120. Therefore the CDU varies across the wafer 120 or across an exposure field 310. It is therefore advantageous to have an extra manipulator that compensates for variations in the other contributors, and this can exactly be done using a bandwidth "control knob," which requires that the bandwidth is measured locally. The method described herein provides the resource needed to control the bandwidth locally at each position within the exposure field 310. In order to know how much to turn the "control knob" and thus how to modify the spectral feature (such as the bandwidth), input on the trajectory of the bandwidth needs to be provided. This input can, for example, come from measurements on the wafer 120, that is, from measurements of CDU of previously processed wafers that can show a distinct fingerprint and then the control knob can be adjusted to thereby adjust the spectral feature, which can be, for example, a target bandwidth, or a target or center wavelength.

Figure 17:
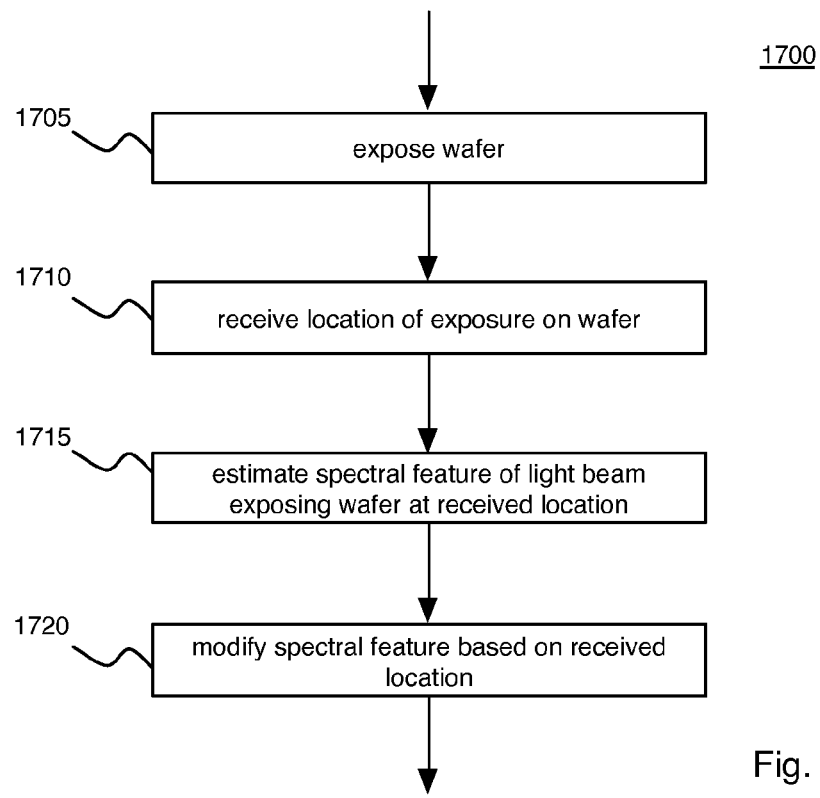
FIG. 17 is a flow chart of a procedure for controlling the spectral feature of the pulsed light beam produced by the optical source and directed to the wafer.

In view of this, and with reference to FIG. 17, a procedure 1700 is performed for controlling the spectral feature of the pulsed light beam 110 produced by the optical source 105 and directed to the wafer 120. The procedure 1700 includes directing the pulsed light beam 110 from the optical source 105 to the lithography exposure apparatus 115 to thereby expose the wafer 120 with the pulsed light beam 110 (1705). A location at which the pulsed light beam 110 is exposing the wafer 120 is received (1710). The spectral feature of the pulsed light beam 110 exposing the wafer 120 at the received location is estimated (1715). The estimating can include receiving a plurality of optical spectra of pulses of the light beam, forming a summed spectrum based on the plurality of optical spectra, and calculating a value that represents the spectral feature based on the summed spectrum. The estimating can be done as described by the procedure 900 (shown in FIG. 9), the procedure 930 (shown in FIG. 11), the procedure 1100 (shown in FIG. 13), and the procedure 1105 (shown in FIG. 15).

The spectral feature of the pulsed light beam 110 is modified based on the received location at which the pulsed light beam 110 is applied to the wafer 120 by adjusting a property of the optical source 105 based on the measured spectral feature (1720).

Figure 18:
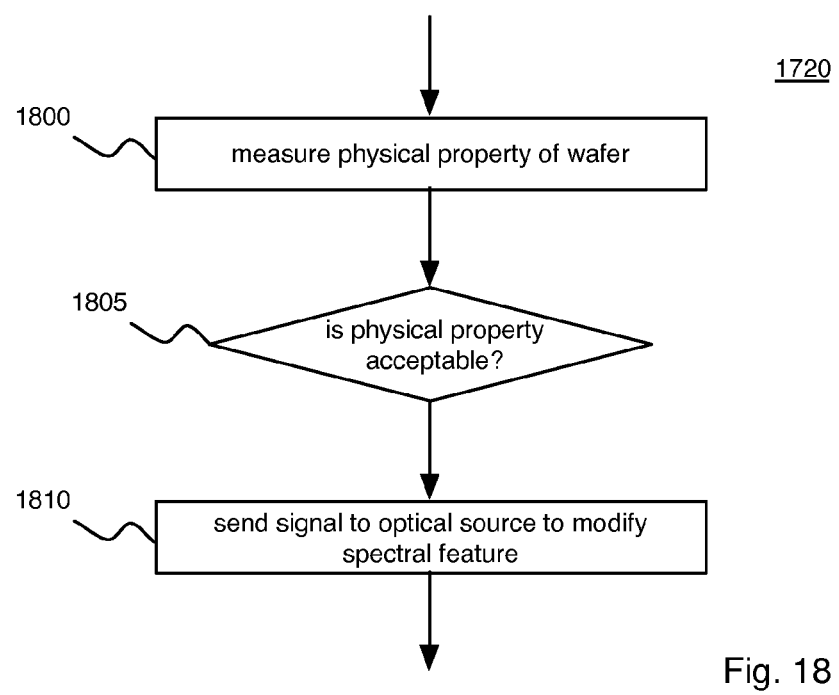
FIG. 18 is a flow chart of an exemplary procedure for modifying the spectral feature of the pulsed light beam by adjusting a property of the optical source based on a measured spectral feature.

Referring to FIG. 18, the procedure 1700, and in particular the step 1720, can include measuring a physical property of the wafer 120 at the received location, determining whether the physical property is acceptable, and if it is determined that the physical property is not acceptable, send a signal to the optical source 105 to modify the spectral feature of the pulsed light beam 110 that impinges on the wafer 120 to adjust the physical property at the wafer 120.

The physical property can be a feature formed on the wafer 120 and that feature is derived from the contrast. For example, one property can be the CDU on the wafer 120; the CDU varies as the contrast changes. Additionally, while the procedure 1700 is described in terms of measuring a physical property, the wafer 120 can contain a plurality of physical features that can be illuminated at the same time, and each physical feature has its own contrast (and a different dependency on contrast). The procedure 1700 can be applied to a plurality of physical properties in serial or in parallel.

Figure 19:
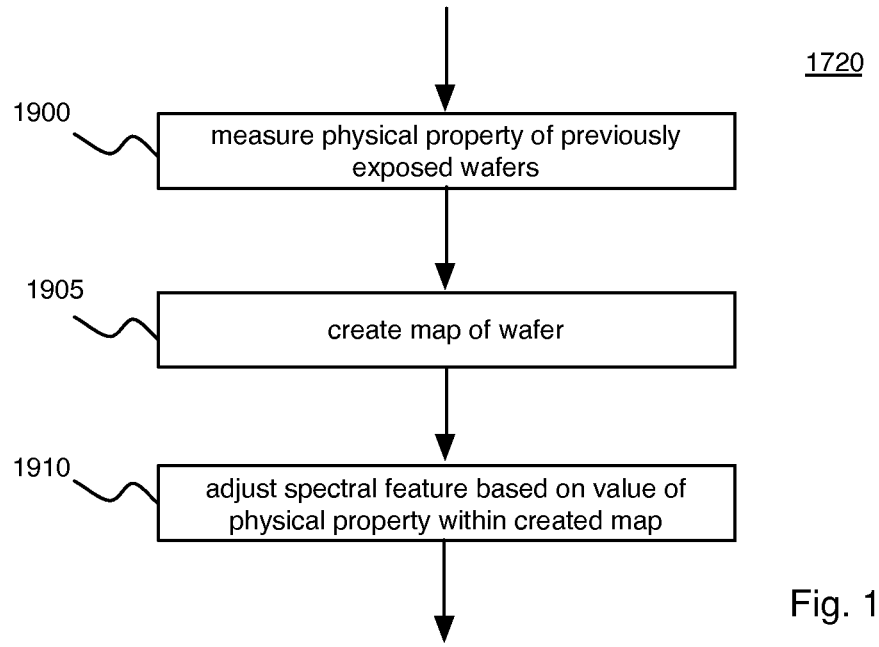
FIG. 19 is a flow chart of an exemplary procedure for modifying the spectral feature of the pulsed light beam by adjusting a property of the optical source based on a measured spectral feature.

Referring to FIG. 19, the procedure 1700, and in particular the step 1720, can include, before processing the wafer 120, measuring the physical property within the scan at each exposure field 310 of one or more previously exposed wafers; and creating a map that estimates how the physical property varies across an entire wafer 120 that is exposed with the optical source 105. The spectral feature of the pulsed light beam that is modified based on the location at which the pulsed light beam is applied to the wafer by adjusting a property of the optical source based on the measured spectral feature can include looking up a value of the physical property within the created map.

Figure 20:
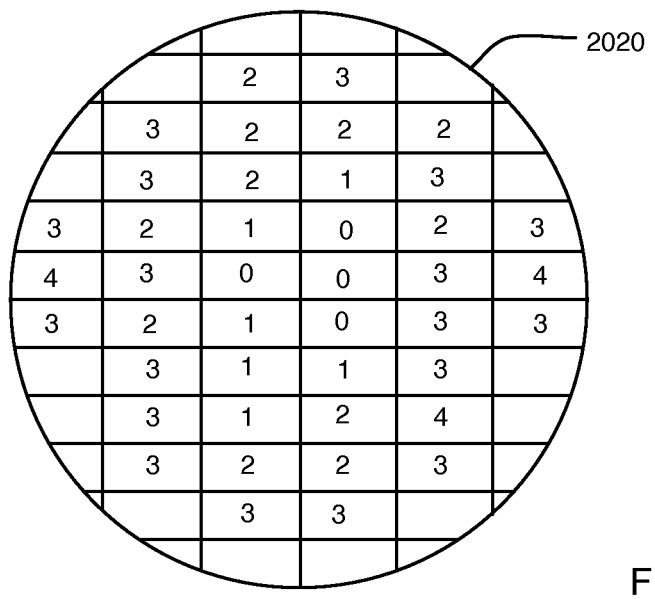
FIG. 20 is a schematic representation of a wafer map illustrating how a physical property varies across the wafer.

For example, with reference to FIG. 20, a schematic representation of a map is shown of a wafer 2020. This map shows how a physical property varies across the wafer 2020. The numbers are provided only as examples and are not meant to be actual values. For example, near the center of the wafer 2020 the physical property value is generally a small value (such as 0 or 1) while along the edge of the wafer 2020 the physical property value is a relatively larger value (such as 3 or 4). Moreover, although the map is broken up into exposure fields in that the physical property is determined for each exposure field, it is also possible to determine the physical property to sub-field levels, for example, with each pulse of the light beam 110 during the scan across an exposure field.

Other implementations are within the scope of the following claims. For example, lithography exposure apparatus 115 can be a maskless system; in this system, the lithography exposure apparatus 115 is designed without a mask. Maskless lithography works slightly differently than lithography that uses a mask in that maskless lithography does not create a uniform illumination; instead the illumination is modulated in a way such that the image of the "reticle" plane (that is, the object plane of the projection lens) on the wafer shows the required pattern. As such the illuminator system 129 is designed to be flexible; a machine that can print only one pattern would be obsolete very quickly. Therefore such an illuminator system 129 within a maskless apparatus 115 can be equipped with a spatial light modulator, which can adjust local intensities in the object plane of the projection lens to the values needed for printing the desired patterns.

What is claimed is:

1. A method of estimating a spectral feature of a pulsed light beam produced by an optical source and directed toward a wafer of a lithography apparatus, the method comprising:
   receiving a set of N optical spectra of pulses of the light beam;
   saving the received N optical spectra to a saved set;
   transforming the optical spectra in the saved set to form a set of transformed optical spectra;
   averaging at least two optical spectra of the set with each other to form an averaged spectrum; and
   estimating a spectral feature of the pulsed light beam based on the averaged spectrum.

2. The method of claim 1, wherein receiving the set of N optical spectra of pulses of the light beam comprises receiving the set of N optical spectra of pulses from an output of a detector of a measurement system.

3. The method of claim 2, wherein receiving the set of N optical spectra of pulses of the light beam comprises, for each of the N optical spectra of pulses, receiving a signal from a detector that is at an output of an etalon placed in the path of a portion of the pulsed light beam.

4. The method of claim 3, wherein the portion of the pulsed light beam is divided from the main portion of the pulsed light beam.

5. The method of claim 1, wherein transforming the optical spectra in the saved set comprises:
estimating a center of each optical spectrum in the saved set;
shifting the optical spectra so that all of the estimated centers align; and
scaling each optical spectrum.

6. The method of claim 1, wherein transforming the optical spectra in the saved set comprises:
estimating a center of each optical spectrum in the saved set; and
shifting the optical spectra so that each of the estimated centers align with a target wavelength.

7. The method of claim 1, further comprising receiving a request to change a wavelength of the pulsed light beam to a new wavelength.

8. The method of claim 7, wherein transforming the optical spectra in the saved set comprises shifting the optical spectra to align their centers with the new wavelength.

9. The method of claim 1, wherein averaging at least two optical spectra with each other comprises:
weighting each optical spectrum of the at least two optical spectra by a weighting factor; and
adding the intensities of each of the weighted optical spectra to form a summed spectrum.

10. The method of claim 9, wherein averaging at least two optical spectra with each other comprises reducing the summed spectrum by a value that is a multiple of N.

11. The method of claim 1, wherein estimating the spectral feature of the pulsed light beam based on the averaged spectrum comprises estimating a bandwidth value of the pulsed light beam based on the averaged spectrum.

12. The method of claim 11, wherein estimating the bandwidth value of the pulsed light beam based on the averaged spectrum comprises measuring a width of the averaged spectrum.

13. The method of claim 12, wherein measuring a width of the averaged spectrum comprises measuring a first width of the averaged spectrum at a first parameter and measuring a second width of the averaged spectrum at a second parameter.

14. The method of claim 11, wherein estimating the bandwidth value of the pulsed light beam based on the averaged spectrum comprises deconvolving a source optical spectrum from an instrument function of the spectrometer that produces the optical spectra and measuring a width of the deconvolved source spectrum.

15. The method of claim 1, further comprising outputting a signal based on the estimated spectral feature, the signal including a set of commands for operating a spectral property selection system connected to the optical source.

16. The method of claim 1, further comprising scanning the pulsed light beam across the exposure field of the wafer, wherein each exposure field receives a plurality of pulses of the light beam.

17. The method of claim 16, wherein estimating the spectral feature of the pulsed light beam based on the averaged spectrum comprises estimating the spectral feature within each exposure field of the wafer.

18. The method of claim 1, further comprising:
removing an oldest optical spectrum from the saved set;
receiving an optical spectrum of another pulse of the light beam; and
saving the received optical spectrum of the other pulse to the saved set to form a refreshed saved set.

19. The method of claim 18, further comprising:
transforming the optical spectra in the refreshed saved set to form a set of transformed optical spectra;
averaging at least two optical spectra of the set with each other to form an averaged spectrum; and
estimating a spectral feature of the pulsed light beam based on the averaged spectrum.

20. The method of claim 18, wherein receiving the optical spectrum of another pulse of the light beam comprises receiving the optical spectrum of the next pulse of the light beam that follows the last pulse that forms the set of N optical spectra.

21. A method of estimating a spectral feature of a pulsed light beam produced by an optical source and directed to an exposure window of a wafer of a lithography apparatus, the exposure window having N pulses, the method comprising:
scanning the pulsed light beam across an exposure field; and
for each exposure window within the exposure field:
receiving one or more optical spectra of pulses of the scanned light beam;
saving the received one or more optical spectra to a saved set;
transforming the one or more optical spectra in the saved set to form a set of transformed optical spectra;
averaging at least two optical spectra of the set with each other to form an averaged spectrum; and
estimating a spectral feature of the pulsed light beam across the exposure window of N pulses from the averaged spectrum.

22. The method of claim 21, wherein receiving the one or more optical spectra of pulses of the scanned light beam comprises receiving the one or more optical spectra of pulses from an output of a detector of a measurement system.

23. The method of claim 21, wherein transforming the one or more optical spectra in the saved set comprises:
estimating a center of each optical spectrum in the saved set;
shifting the optical spectra so that all of the estimated centers align; and
scaling each optical spectrum.

24. The method of claim 21, wherein averaging at least two optical spectra with each other comprises:
weighting each optical spectrum of the at least two optical spectra by a weighting factor; and
adding the intensities of each of the weighted optical spectra to form a summed spectrum.

25. The method of claim 21, wherein estimating the spectral feature of the pulsed light beam based on the averaged spectrum comprises determining a metric value of the bandwidth of the pulsed light beam based on the averaged spectrum.

26. The method of claim 21, wherein each exposure field is shifted from the preceding or the succeeding exposure field in time by one or more pulses of the scanned light beam.

27. The method of claim 21, further comprising, for at least some of the exposure windows within the exposure field, removing an oldest optical spectrum from the saved set before receiving the one or more optical spectra of pulses of the scanned light beam.

28. The method of claim 21, wherein, for at least one exposure window within the exposure field, receiving one or more optical spectra of pulses of the scanned light beam comprises receiving N optical spectra of pulses of the scanned light beam.

29. A light system that produces a pulsed light beam configured to be directed to an exposure window of N pulses of a lithography exposure apparatus, the light system comprising:
 an optical source configured to generate the light beam;
 a beam directing system configured to direct the light beam to the lithography exposure apparatus;
 a control system configured to:
  scan the pulsed light beam across an exposure field; and
  for each exposure window within the exposure field:
   receive one or more optical spectra of pulses of the scanned light beam;
   save the received one or more optical spectra to a saved set;
   transform the one or more optical spectra in the saved set to form a set of transformed spectra;
   average the transformed optical spectra in the set with each other to form an averaged spectrum;
   estimate a spectral feature of the pulsed light beam across the exposure window of N pulses from the averaged spectrum; and
   output a signal based on the estimated spectral feature; and
 a spectral property selection system connected to the optical source, the spectral property selection system receiving the outputted signal and being configured to adjust a spectral property of the light beam within the optical source based on the outputted signal.

* * * * *